United States Patent
Kato et al.

(10) Patent No.: US 9,523,913 B2
(45) Date of Patent: Dec. 20, 2016

(54) PATTERN FORMING METHOD, ACTINIC RAY-SENSITIVE OR RADIATION-SENSITIVE RESIN COMPOSITION, RESIST FILM, METHOD FOR MANUFACTURING ELECTRONIC DEVICE, AND ELECTRONIC DEVICE

(71) Applicant: FUJIFILM Corporation, Tokyo (JP)

(72) Inventors: Keita Kato, Shizuoka (JP); Michihiro Shirakawa, Shizuoka (JP); Hidenori Takahashi, Shizuoka (JP); Shoichi Saitoh, Shizuoka (JP); Fumihiro Yoshino, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/093,781

(22) Filed: Dec. 2, 2013

(65) Prior Publication Data

US 2014/0087310 A1 Mar. 27, 2014

Related U.S. Application Data

(63) Continuation of application No. PCT/JP2012/064244, filed on May 25, 2012.

(60) Provisional application No. 61/534,569, filed on Sep. 14, 2011.

(30) Foreign Application Priority Data

May 30, 2011 (JP) ................. 2011-120956
Apr. 12, 2012 (JP) ................. 2012-091329

(51) Int. Cl.
*G03F 7/004* (2006.01)
*G03F 7/30* (2006.01)
*G03F 7/038* (2006.01)
*G03F 7/039* (2006.01)
*C08F 220/12* (2006.01)
*G03F 7/32* (2006.01)

(52) U.S. Cl.
CPC ........... *G03F 7/0382* (2013.01); *C08F 220/12* (2013.01); *G03F 7/0392* (2013.01); *G03F 7/0397* (2013.01); *G03F 7/30* (2013.01); *G03F 7/325* (2013.01)

(58) Field of Classification Search
CPC ........ G03F 7/38; G03F 7/0392; G03F 7/0397; G03F 7/30; G03F 7/0382; G03F 7/325
USPC ..... 430/326, 330, 331, 270.1, 905, 910, 325
See application file for complete search history.

(56) References Cited

U.S. PATENT DOCUMENTS

| | | | | |
|---|---|---|---|---|
| 4,743,529 A | * | 5/1988 | Farid et al. ................. | 430/281.1 |
| 6,303,266 B1 | * | 10/2001 | Okino ................... | G03F 7/0382 |
| | | | | 430/270.1 |
| 2002/0090569 A1 | * | 7/2002 | Suzuki .................. | G03F 7/0045 |
| | | | | 430/270.1 |
| 2005/0048402 A1 | * | 3/2005 | Mizutani ............... | G03F 7/0046 |
| | | | | 430/281.1 |
| 2007/0072115 A1 | * | 3/2007 | Hatakeyama ......... | C08F 220/18 |
| | | | | 430/270.1 |
| 2007/0148585 A1 | * | 6/2007 | Kaneko ................. | C08F 212/14 |
| | | | | 430/270.1 |
| 2007/0207408 A1 | * | 9/2007 | Hatakeyama et al. ..... | 430/270.1 |
| 2008/0187860 A1 | | 8/2008 | Tsubaki et al. | |
| 2008/0261150 A1 | | 10/2008 | Tsubaki et al. | |
| 2009/0170029 A1 | | 7/2009 | Choi et al. | |
| 2009/0297979 A1 | * | 12/2009 | Hatakeyama ........... | C07C 69/54 |
| | | | | 430/270.1 |
| 2010/0028807 A1 | * | 2/2010 | Takemoto ............ | C07D 207/46 |
| | | | | 430/286.1 |
| 2010/0035192 A1 | | 2/2010 | Ando et al. | |
| 2010/0304299 A1 | * | 12/2010 | Dimov .................. | G03F 7/0045 |
| | | | | 430/270.1 |
| 2010/0323305 A1 | | 12/2010 | Tsubaki et al. | |
| 2011/0177462 A1 | | 7/2011 | Hatakeyama et al. | |
| 2011/0300485 A1 | | 12/2011 | Tsubaki et al. | |
| 2012/0058436 A1 | | 3/2012 | Tsubaki et al. | |
| 2012/0315449 A1 | | 12/2012 | Tsubaki et al. | |

FOREIGN PATENT DOCUMENTS

| | | |
|---|---|---|
| CN | 101462956 A | 6/2009 |
| JP | 2008292975 A | 12/2008 |
| JP | 20100040849 A | 2/2010 |
| JP | 2010217884 A | 9/2010 |

(Continued)

OTHER PUBLICATIONS

Gokan, et al.; "Dry Etch Resistance of Organic Materials"; J. Electrochem. Soc.: Solid-State Science and Technology; Jan. 1983; vol. 130 No. 1; pp. 143-146.

(Continued)

*Primary Examiner* — John S Chu
(74) *Attorney, Agent, or Firm* — Sughrue Mion, PLLC

(57) ABSTRACT

A pattern forming method comprises (i) a step of forming a film by using an actinic ray-sensitive or radiation-sensitive resin composition containing: (A) a resin containing a repeating unit having a group capable of decomposing by the action of an acid to produce a polar group, (B) a compound capable of generating an acid upon irradiation with an actinic ray or radiation, and (C) a solvent, (ii) a step of exposing the film, and (iii) a step of developing the exposed film by using an organic solvent-containing developer to form a negative pattern, wherein the content of a repeating unit represented by the following formula (I) is less than 20 mol % based on all repeating units in the resin (A) and the resin (A) contains a repeating unit having a non-phenolic aromatic group other than the repeating unit represented by the specific formula.

12 Claims, No Drawings

(56) References Cited

FOREIGN PATENT DOCUMENTS

| JP | 2011227463 A | 11/2010 |
|---|---|---|
| JP | 2011170316 A | 9/2011 |
| KR | 10-2010-0096051 A | 9/2010 |
| TW | 201039055 A1 | 11/2010 |
| WO | 2011-122336 A1 | 10/2011 |

OTHER PUBLICATIONS

International Search Report issued Jun. 26, 2012 in corresponding International Application No. PCT/JP2012/064244.
Written Opinion issued Jun. 26, 2012 in corresponding International Application No. PCT/JP2012/064244.
Japanese Office Action dated Jul. 8, 2014 issued by the Japanese Patent Office in counterpart Japanese Patent Application No. JP2012-091329.
Office Action dated Jan. 7, 2014 issued by the Korean Intellectual Property Office in counterpart Korean Patent Application No. 10-2013-7031479.
Extended European Search Report issued on Feb. 3, 2015 by the European Patent Office in counterpart EP Application No. 12793094.9.
Office Action dated Nov. 4, 2014, issued by the State Intellectual Property Office of P.R. China in counterpart Chinese Application No. 201280026472.3.
Office Action dated Oct. 26, 2015, issued by the Taiwanese Intellectual Property Office in counterpart Taiwanese Application No. 101119042.

* cited by examiner

PATTERN FORMING METHOD, ACTINIC RAY-SENSITIVE OR RADIATION-SENSITIVE RESIN COMPOSITION, RESIST FILM, METHOD FOR MANUFACTURING ELECTRONIC DEVICE, AND ELECTRONIC DEVICE

CROSS REFERENCE TO RELATED APPLICATION

This is a continuation of International Application No. PCT/JP2012/064244 filed on May 25, 2012, and claims priority from Japanese Patent Application No. 2011-120956, filed on May 30, 2011, and Japanese Patent Application No. 2012-091329, filed on Apr. 12, 2012, and U.S. provisional application No. 61/534,569 filed on Sep. 14, 2011, the entire disclosures of which are incorporated therein by reference.

TECHNICAL FIELD

The present invention relates to a pattern forming method suitably used for the process of producing a semiconductor such as IC or the production of a liquid crystal device or a circuit board such as thermal head and further for the lithography in other photo-fabrication processes, an actinic ray-sensitive or radiation-sensitive resin composition, a resist film, a manufacturing method of an electronic device, and an electronic device. More specifically, the present invention relates to a pattern forming method suitably used for exposure by a KrF exposure apparatus, an actinic ray-sensitive or radiation-sensitive resin composition, a resist film, a method for manufacturing an electronic device, and an electronic device.

BACKGROUND ART

Since the advent of a resist for KrF excimer laser (248 nm), an image forming method called chemical amplification is used as an image forming method for a resist so as to compensate for sensitivity reduction caused by light absorption. For example, the image forming method by positive chemical amplification is an image forming method of decomposing an acid generator in the exposed area upon exposure with excimer laser, electron beam, extreme-ultraviolet light or the like to produce an acid, converting an alkali-insoluble group into an alkali-soluble group by using the generated acid as a reaction catalyst in the baking after exposure (PEB: Post Exposure Bake), and removing the exposed area with an alkali developer.

As for the alkali developer used in the method above, various alkali developers have been proposed, but an aqueous alkali developer of 2.38 mass % TMAH (an aqueous tetramethylammonium hydroxide solution) is being used for general purposes.

On the other hand, as well as the currently predominant positive resist, formation of a fine pattern by a negative image is also being developed (see, for example, JP-A-2010-40849 (the term "JP-A" as used herein means an "unexamined published Japanese patent application"), JP-A-2008-292975, JP-A-2010-217884). Because, in the production of a semiconductor device or the like, patterns having various profiles such as line, trench and hole need to be formed and some patterns are difficult to form by the current positive resist.

In the leading-edge pattern formation method of which development is being recently promoted, not only a positive pattern but also a negative pattern can be formed with high resolution by using an ArF excimer laser and further performing immersion exposure. A resin having an aromatic ring or a double bond has absorption for light at 193 nm that is ArF light, and cannot ensure sufficient transmittance. Therefore, the resin in the resist composition for ArF exposure is composed of an aliphatic component in many cases. However, it is difficult to design a resin composed of an aliphatic component to enhance the carbon density, that is, to reduce a so-call Ohnishi parameter, and this is disadvantageous in terms of etching resistance (see, for example, H. Gokan, S. Esho and Y. Ohnishi, *J. Electrochem. Soc.* 143, 130 (1983)).

Also, in the production of a semiconductor, not only ultimate refinement is required, but also, in view of effective utilization of existing equipment, it is being studied to substitute KrF exposure for a part of the process which has been conventionally performed by ArF exposure, but this opposes the historical background that the ArF exposure technique has been developed to surpass the limit of KrF exposure, and such substitution of KrF exposure for a part of the ArF exposure process may not merely face a refinement task but also involve various problems associated with, for example, improvement of materials (such as resin) used and difference in the exposure mechanism, which are technically difficult to solve.

In addition, as an application of the above-described resist technology, there is evolving usage for microfabrication, such as application to ion implantation where a resist composition is used when implanting ion (charge injection), which is one step of the logic device fabrication or the like.

In the case of using a resist composition for ion implantation, the resist composition is sometimes coated, exposed and developed on a substrate having previously formed thereon a pattern (hereinafter, referred to as a stepped substrate), and microfabrication on a stepped substrate is required.

However, the profile of the obtained pattern may be impaired by the effect of a standing wave generated due to reflection of exposure light from the substrate or by the diffused reflection of exposure light due to a stepped portion in the stepped substrate.

Also, a method of providing an anti-reflective film (Bottom Anti-Reflective Coating; BARC) between the resist film and the substrate is known, but when an anti-reflective film is provided, particularly in the case of using the resist composition for the application to ion implantation, a step of removing the anti-reflective film by etching is required before implanting an ion, and this incurs an increase in the production cost.

SUMMARY OF INVENTION

The present inventors have found that when a resist resin material having a hydroxystyrene-based repeating unit conventionally used for applications performing the development with an alkali developer is applied to the negative pattern forming method including organic solvent development using KrF excimer laser light, the pattern has a problem in the resolution and allowable level of rectangularity due to excessively large solubility of the repeating unit for an organic solvent.

Considering these problems, an object of the present invention is to provide a pattern forming method in which a practically allowable level of rectangularity is maintained by preventing the resolution and rectangularity from reduction ascribable to unintended dissolution of a pattern part during organic solvent development and the resist pattern has high resolution and excellent etching resistance at dry etching and which is suitable particularly for KrF exposure, an actinic ray-sensitive or radiation-sensitive resin composition used therefor, a resist film, a manufacturing method of an electronic device, and an electronic device.

Another object of the present invention is to provide a pattern forming method suitable particularly for KrF exposure, where an anti-reflective film is not required and in a negative pattern forming method by organic solvent development, a pattern having high rectangularity can be formed on a stepped substrate, an actinic ray-sensitive or radiation-sensitive resin composition used therefor, a resist film, a method for manufacturing an electronic device, and an electronic device.

The present invention has the following configurations, and the above-described object of the present invention is attained by these configurations.

[1] A pattern forming method comprising:
(i) a step of forming a film by using an actinic ray-sensitive or radiation-sensitive resin composition containing:
(A) a resin containing a repeating unit having a group capable of decomposing by the action of an acid to produce a polar group,
(B) a compound capable of generating an acid upon irradiation with an actinic ray or radiation, and
(C) a solvent,
(ii) a step of exposing the film, and
(iii) a step of developing the exposed film by using an organic solvent-containing developer to form a negative pattern,
wherein
the content of a repeating unit represented by the following formula (I) is less than 20 mol % based on all repeating units in the resin (A) and the resin (A) contains a repeating unit having a non-phenolic aromatic group other than the repeating unit represented by the following formula (I):

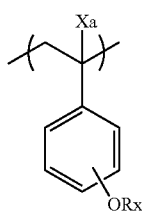

in formula (I),
Xa represents a hydrogen atom or an alkyl group, and
Rx represents a hydrogen atom or a group capable of decomposing and leaving by the action of an acid.

[2] The pattern forming method as described in [1], wherein (ii) the step of exposing the film is performed with a KrF excimer laser, an EUV light or an electron beam.

[3] The pattern forming method as described in [1] or [2], wherein (ii) the step of exposing the film is performed with a KrF excimer laser.

[4] The pattern forming method as described in any one of [1] to [3], wherein the resin (A) does not contain the repeating unit represented by formula (I).

[5] The pattern forming method as described in any one of [1] to [4], wherein the repeating unit having a non-phenolic aromatic group is a repeating unit represented by the following formula (II):

in formula (II),
$R_{01}$ represents a hydrogen atom or an alkyl group,
X represents a single bond or a divalent linking group,
Ar represents a non-phenolic aromatic group, and
$R_4$ represents a single bond or an alkylene group.

[6] The pattern forming method as described in [5], wherein in formula (II), X is —COO— or —CONH—.

[7] The pattern forming method as described in any one of [1] to [6], wherein the repeating unit having a group capable of decomposing by the action of an acid to produce a polar group is a repeating unit represented by the following formula (III):

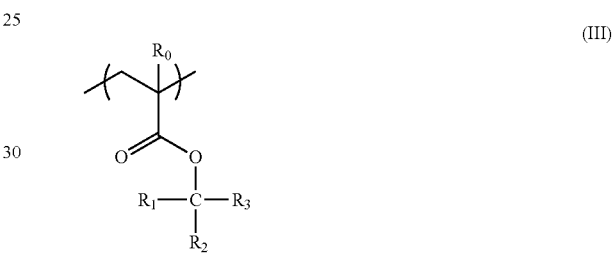

in formula (III),
$R_0$ represents a hydrogen atom or an alkyl group,
each of $R_1$ to $R_3$ independently represents an alkyl group or a cycloalkyl group, and
two members out of $R_1$ to $R_3$ may combine to form a monocyclic or polycyclic cycloalkyl group.

[8] The pattern forming method as described in [7], wherein the content of the repeating unit represented by formula (III) is from 20 to 90 mol % based on all repeating units in the resin (A).

[9] The pattern forming method as described in any one of [1] to [8], wherein the developer is a developer containing at least one kind of an organic solvent selected from the group consisting of a ketone-based solvent, an ester-based solvent, an alcohol-based solvent, an amide-based solvent and an ether-based solvent.

[10] An actinic ray-sensitive or radiation-sensitive resin composition that is used for the pattern forming method described in any one of [1] to [8].

[11] A resist film formed of the actinic ray-sensitive or radiation-sensitive resin composition described in [10].

[12] A method for manufacturing an electronic device, comprising the pattern forming method described in any one of [1] to [9].

[13] An electronic device manufactured by the method for manufacturing an electronic device described in [12].

The present invention preferably further includes the following configurations.

[14] The pattern forming method as described in [5], wherein the content of the repeating unit represented by formula (II) is from 20 to 60 mol % based on all repeating unit in the resin (A).

[15] The pattern forming method as described in any one of [1] to [9] and [14], wherein the compound (B) is a nonionic compound.

[16] The pattern forming method as described in any one of [1] to [9], [14] and [15], wherein the content of the organic solvent in the organic solvent-containing developer is from 90 to 100 mass % based on the entire amount of the developer.

[17] The pattern forming method as described in any one of [1] to [9] and [14] to [16], wherein the resin (A) is a resin further containing a repeating unit having a hydroxyadamantyl group or a dihydroxyadamantyl group.

[18] The pattern forming method as described in any one of [1] to [9] and [14] to [17], wherein said resin (A) further contains a repeating unit having a lactone structure.

[19] The actinic ray-sensitive or radiation-sensitive resin composition as described in [10], which is a chemical amplification resist composition for organic solvent development.

According to the present invention, a pattern forming method in which a practically allowable level of rectangularity is maintained by preventing the resolution and rectangularity from reduction ascribable to unintended dissolution of a pattern part during organic solvent development and the resist pattern has high resolution and etching resistance at dry etching is excellent and which is suitable particularly for KrF exposure, an actinic ray-sensitive or radiation-sensitive resin composition used therefor, a resist film, a method for manufacturing an electronic device, and an electronic device, can be provided.

Also, a pattern forming method suitable particularly for KrF exposure, where an anti-reflective film is not required and in a negative pattern forming method by organic solvent development, a pattern having high rectangularity can be formed on a stepped substrate, an actinic ray-sensitive or radiation-sensitive resin composition used therefor, a resist film, a method for manufacturing an electronic device, and an electronic device, can be provided.

DESCRIPTION OF EMBODIMENTS

The mode for carrying out the present invention is described below.

In the description of the present invention, when a group (atomic group) is denoted without specifying whether substituted or unsubstituted, the group encompasses both a group having no substituent and a group having a substituent. For example, "an alkyl group" encompasses not only an alkyl group having no substituent (unsubstituted alkyl group) but also an alkyl group having a substituent (substituted alkyl group).

In the description of the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam (EB). Also, in the present invention, the "light" means an actinic ray or radiation.

Furthermore, in the description of the present invention, unless otherwise indicated, the "exposure" encompasses not only exposure to a mercury lamp, a far ultraviolet ray typified by excimer laser, an extreme-ultraviolet ray, an X-ray, EUV light or the like but also lithography with a particle beam such as electron beam and ion beam.

The pattern forming method of the present invention comprises:

(i) a step of forming a film by using an actinic ray-sensitive or radiation-sensitive resin composition containing:
  (A) a resin containing a repeating unit having a group capable of decomposing by the action of an acid to produce a polar group,
  (B) a compound capable of generating an acid upon irradiation with an actinic ray or radiation, and
  (C) a solvent,
(ii) a step of exposing the film, and
(iii) a step of developing the exposed film by using an organic solvent-containing developer to form a negative pattern,
wherein
the content of a repeating unit represented by the following formula (I) is less than 20 mol % based on all repeating units in the resin (A) and the resin (A) contains a repeating unit having a non-phenolic aromatic group other than the repeating unit represented by the following formula (I):

in formula (I),

Xa represents a hydrogen atom or an alkyl group, and

Rx represents a hydrogen atom or a group capable of decomposing and leaving by the action of an acid.

The pattern forming method of the present invention uses an actinic ray-sensitive or radiation-sensitive resin composition comprising (A) a resin containing a repeating unit having a group capable of decomposing by the action of an acid to produce a polar group (hereinafter, sometimes simply referred to as an "acid-decomposable group") and a repeating unit having a non-phenolic aromatic group other than the repeating unit represented by formula (I).

The reason why the pattern forming method of the present invention ensures, particularly in a negative pattern formation by an organic solvent-containing developer of KrF exposure, a resist pattern exhibiting high resolution, excellent etching resistance at dry etching and formation of a pattern having high rectangularity on a stepped substrate without requiring an anti-reflective film while maintaining an allowable level of rectangularity is not clearly known but is presumed as follows.

In the case where a resin containing 20 mol % or more of a hydroxystyrene-based repeating unit such as repeating unit represented by formula (I), which has been conventionally used for alkali development of KrF exposure as described above, is applied to a negative pattern forming method by organic solvent development, the resolution and rectangularity of the pattern can be hardly controlled due to high solubility for an organic solvent.

On the other hand, in the present invention, the resin (A) has both the repeating unit having an acid-decomposable group and the repeating unit having a non-phenolic aromatic group and therefore, it is presumed that the dissolution contrast is enhanced by sufficiently reducing the solubility of the exposed area for an organic developer and at the same time, adequately maintaining the solubility of the unexposed area and in turn, high resolution and an allowable level of rectangularity of a resist pattern, which are unachievable by a resin containing 20 mol % or more of the hydroxystyrene-based repeating unit, can be achieved.

Also, in the present invention, the resin (A) contains the repeating unit having a non-phenolic aromatic group, and this presumably makes it possible to achieve a high carbon density and high etching resistance which are unachievable by a resin for ArF exposure composed of an aliphatic component in many cases as described above.

The resin (A) has the above-described non-phenolic aromatic group and therefore, can absorb exposure light such as KrF excimer laser without requiring an anti-reflective film, and this presumably makes it possible to reduce diffused reflection or the like of exposure light in a stepped portion of a stepped substrate and form a pattern having high rectangularity.

In the pattern forming method of the present invention, the developer is preferably a developer containing at least one kind of an organic solvent selected from the group consisting of a ketone-based solvent, an ester-based solvent, an alcohol-based solvent, an amide-based solvent and an ether-based solvent.

The pattern forming method of the present invention preferably further comprises (iv) a step of rinsing the film with an organic solvent-containing rinsing solution.

The rinsing solution is preferably a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent.

The pattern forming method of the present invention preferably comprises (v) a heating step after the exposure step (ii).

In the pattern forming method of the present invention, the resin (A) is a resin capable of increasing the polarity by the action of an acid to increase the solubility for an alkali developer, and the method may further comprise (vi) a step of performing development by using an alkali developer.

In the pattern forming method of the present invention, the exposure step (ii) may be performed a plurality of times.

In the pattern forming method of the present invention, the heating step (v) may be performed a plurality of times.

The resist film of the present invention is a film formed of the above-described actinic ray-sensitive or radiation-sensitive resin composition, and this film is formed, for example, by coating the actinic ray-sensitive or radiation-sensitive resin composition on a base material.

The actinic ray-sensitive or radiation-sensitive resin composition which can be used in the present invention is described below.

The present invention also relates to the actinic ray-sensitive or radiation-sensitive resin composition described below.

The actinic ray-sensitive or radiation-sensitive resin composition according to the present invention is used for negative development (development where the solubility for developer is decreased upon exposure, as a result, the exposed area remains as a pattern and the unexposed area is removed). That is, the actinic ray-sensitive or radiation-sensitive resin composition according to the present invention can be an actinic ray-sensitive or radiation-sensitive resin composition for organic solvent development, which is used for development using an organic solvent-containing developer. The term "for organic solvent development" as used herein means usage where the composition is subjected to at least a step of performing development by using an organic solvent-containing developer.

The actinic ray-sensitive or radiation-sensitive resin composition of the present invention is typically a resist composition and is preferably a negative resist composition (that is, a resist composition for organic solvent development), because particularly high effects can be obtained. The composition according to the present invention is typically a chemical amplification resist composition.

[1] (A) Resin containing a repeating unit having an acid-decomposable group, wherein the content of a repeating unit represented by the following formula (I) is less than 20 mol % based on all repeating units in the resin and the resin contains a repeating unit having a non-phenolic aromatic group other than the repeating unit represented by the following formula (I) (hereinafter, sometimes simply referred to as "resin (A)")

In the above formula (I), Xa represents a hydrogen atom or an alkyl group.

Rx represents a hydrogen atom or a group capable of decomposing and leaving by the action of an acid.

The resin (A) used for the actinic ray-sensitive or radiation-sensitive resin composition according to the present invention is a resin having an acid-decomposable group (hereinafter, sometimes referred to as an "acid-decomposable resin") and is a resin capable of increasing the polarity by the action of an acid to decrease the solubility for an organic solvent-containing developer.

The resin (A) used for the actinic ray-sensitive or radiation-sensitive resin composition according to the present invention includes, for example, a resin having an acid-decomposable group on either one or both of the main chain and the side chain of the resin.

Incidentally, this resin (A) is at the same time a resin capable of increasing the polarity by the action of an acid to increase the solubility for an alkali developer.

[Repeating Unit Having Acid-Decomposable Group]

The acid-decomposable group preferably has a structure where a polar group is protected by a group capable of leaving by the action of an acid.

The polar group is not particularly limited as long as it is a group capable of being sparingly solubilized or insolubilized in an organic solvent-containing developer, but examples thereof include an acidic group (a group capable of dissociating in an aqueous 2.38 mass % tetramethylammonium hydroxide solution which has been conventionally used as the developer for a resist) such as a carboxyl group, a sulfonic acid group, and an alcoholic hydroxyl group.

In addition, the alcoholic hydroxyl group is a hydroxyl group bonded to a hydrocarbon group and indicates a hydroxyl group except for a hydroxyl group directly bonded on an aromatic ring (phenolic hydroxyl group), and an aliphatic alcohol as an acid group, which is substituted with an electron-withdrawing group such as fluorine atom at the α-position (for example, a hexafluoroisopropanol group), is excluded. The alcoholic hydroxyl group is preferably a hydroxyl group having a pKa of 12 to 20.

The group preferred as the acid-decomposable group is a group where a hydrogen atom of the group above is substituted for by a group capable of leaving by the action of an acid.

Examples of the group capable of leaving by the action of an acid include —C($R_{36}$)($R_{37}$)($R_{38}$), —C($R_{36}$)($R_{37}$)(O$R_{39}$) and —C($R_{01}$)($R_{02}$)(O$R_{39}$).

In the formulae above, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The alkyl group of $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group and an octyl group.

The cycloalkyl group of $R_{36}$ to $R_{39}$, $R_{01}$ and $R_{02}$ may be monocyclic or polycyclic. The monocyclic cycloalkyl group is preferably a cycloalkyl group having a carbon number of 3 to 8, and examples thereof include a cyclopropyl group, a cyclobutyl group, a cyclopentyl group, a cyclohexyl group, and a cyclooctyl group. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group, and an androstanyl group. Incidentally, at least one carbon atom in the cycloalkyl group may be substituted with a heteroatom such as oxygen atom.

The aryl group of $R_{36}$ to $R_{39}$, $R_{01}$ and $R_{02}$ is preferably an aryl group having a carbon number of 6 to 10, and examples thereof include a phenyl group, a naphthyl group, and an anthryl group.

The aralkyl group of $R_{36}$ to $R_{39}$, $R_{01}$ and $R_{02}$ is preferably an aralkyl group having a carbon number of 7 to 12, and examples thereof include a benzyl group, a phenethyl group, and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group and a cyclohexenyl group.

The ring formed by combining $R_{36}$ and $R_{37}$ is preferably a cycloalkyl group (monocyclic or polycyclic). The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group, more preferably a monocyclic cycloalkyl group having a carbon number of 5 to 6, still more preferably a mono cyclic cycloalkyl group having a carbon number of 5.

The repeating unit having an acid-decomposable group contained in the resin (A) is preferably a repeating unit represented by the following formula (III):

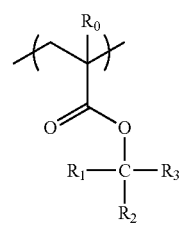

(III)

In formula (III), $R_0$ represents a hydrogen atom or a linear or branched alkyl group.

Each of $R_1$ to $R_3$ independently represents a linear or branched alkyl group or a monocyclic or polycyclic cycloalkyl group.

Two members out of $R_1$ to $R_3$ may combine to form a monocyclic or polycyclic cycloalkyl group.

The linear or branched alkyl group of $R_0$ may have a substituent and is preferably a linear or branched alkyl group having a carbon number of 1 to 4, and examples thereof include a methyl group, an ethyl group, an n-propyl group, an isopropyl group, an n-butyl group, an isobutyl group, and a tert-butyl group. Examples of the substituent include a hydroxyl group and a halogen atom (for example, fluorine atom).

$R_0$ is preferably a hydrogen atom, a methyl group, a trifluoromethyl group or a hydroxymethyl group.

The alkyl group of $R_1$ to $R_3$ is preferably an alkyl group having a carbon number of 1 to 4, such as methyl group, ethyl group, n-propyl group, isopropyl group, n-butyl group, isobutyl group and tert-butyl group.

The cycloalkyl group of $R_1$ to $R_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining two members out of $R_1$ to $R_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group, more preferably a monocyclic cycloalkyl group having a carbon number of 5 to 6.

As one of preferred embodiments, an embodiment where $R_1$ is a methyl group or an ethyl group and $R_2$ and $R_3$ are combined to form the above-described cycloalkyl group is preferred.

Each of the groups above may have a substituent, and examples of the substituent include a hydroxyl group, a halogen atom (such as fluorine atom), an alkyl group (having a carbon number of 1 to 4), a cycloalkyl group (having a carbon number of 3 to 8), an alkoxy group (having a carbon number of 1 to 4), a carboxyl group, and an alkoxycarbonyl group (having a carbon number of 2 to 6). The carbon number is preferably 8 or less.

A particularly preferred embodiment of the repeating unit represented by formula (III) is an embodiment where each of $R_1$, $R_2$ and $R_3$ independently represents a linear or branched alkyl group.

In this embodiment, the linear or branched alkyl group of $R_1$, $R_2$ and $R_3$ is preferably an alkyl group having a carbon number of 1 to 4, and examples thereof include a methyl group, an ethyl group, an n-propyl group, an isopropyl group, an n-butyl group, an isobutyl group and a tert-butyl group.

R$_1$ is preferably a methyl group, an ethyl group, an n-propyl group or an n-butyl group, more preferably a methyl group or an ethyl group, still more preferably a methyl group.

R$_2$ is preferably a methyl group, an ethyl group, an n-propyl group, an isopropyl group or an n-butyl group, more preferably a methyl group or an ethyl group, still more preferably a methyl group.

R$_3$ is preferably a methyl group, an ethyl group, an n-propyl group, an isopropyl group, an n-butyl group, an isobutyl group or a tert-butyl group, more preferably a methyl group, an ethyl group, an isopropyl group or an isobutyl group, still more preferably a methyl group, an ethyl group or an isopropyl group.

Specific preferred examples of the repeating unit having an acid-decomposable group are illustrated below, but the present invention is not limited thereto.

In specific examples, Rx represents a hydrogen atom, CH$_3$, CF$_3$ or CH$_2$OH, and each of Rxa and Rxb represents an alkyl group having a carbon number of 1 to 4. Z represents a substituent, and when a plurality of Zs are present, each Z may be the same as or different from every other Z. p represents 0 or a positive integer. Specific examples and preferred examples of Z are the same as specific examples and preferred examples of the substituent which each of the groups such as R$_1$ to R$_3$ may have.

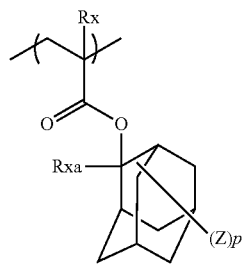
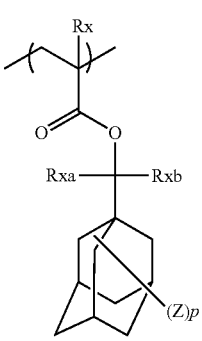
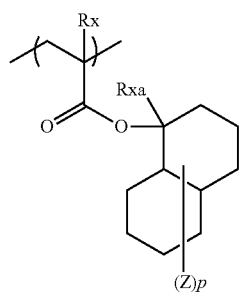
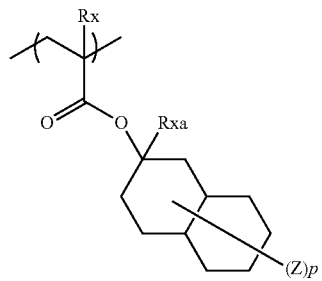

-continued

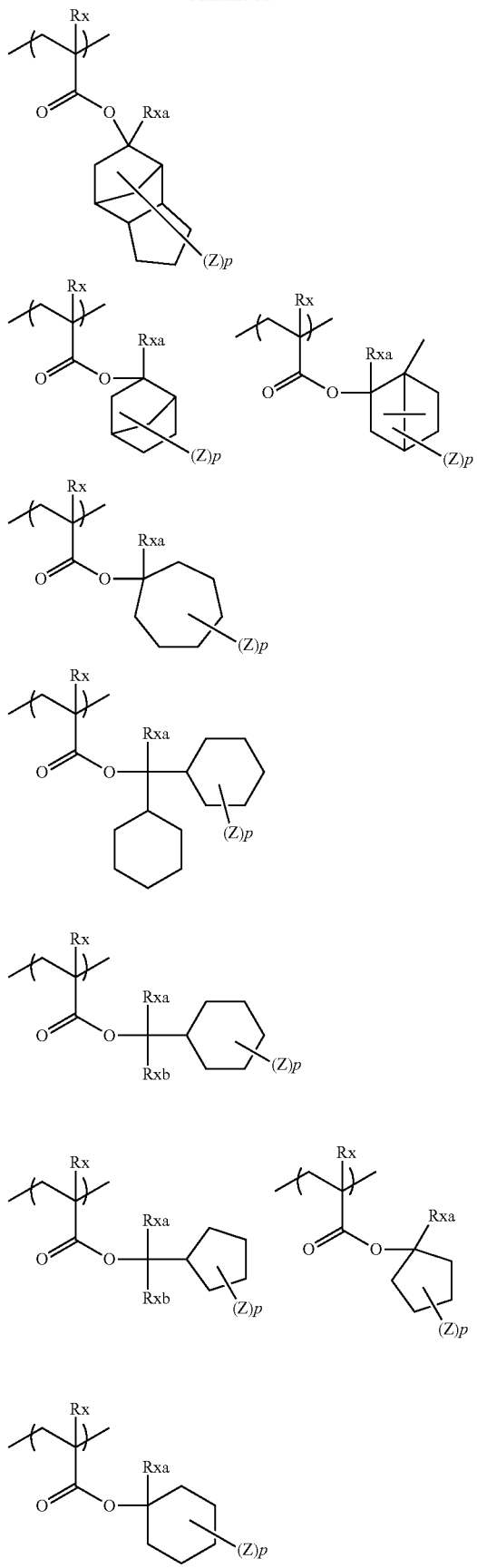

-continued
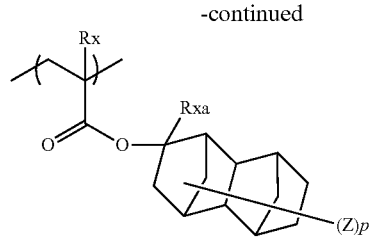
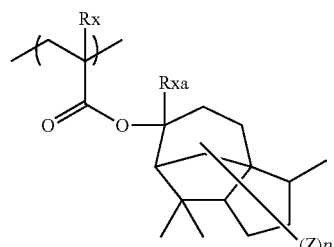
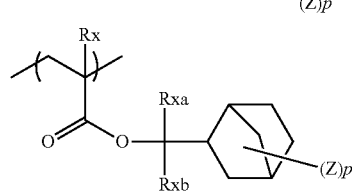
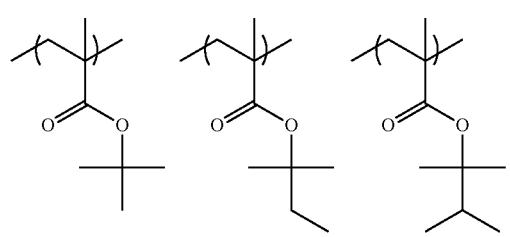
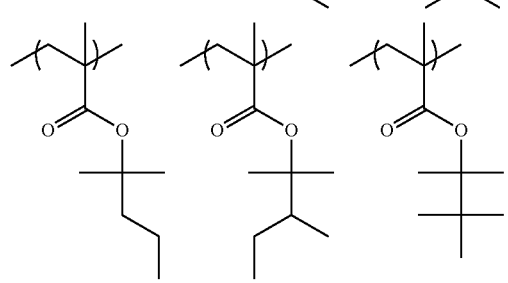
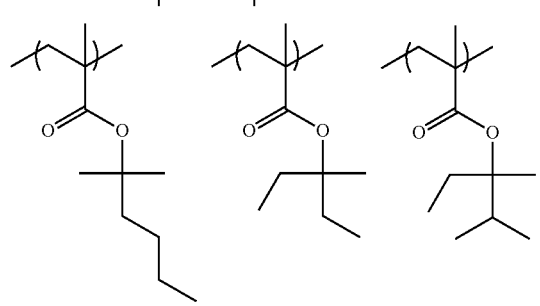
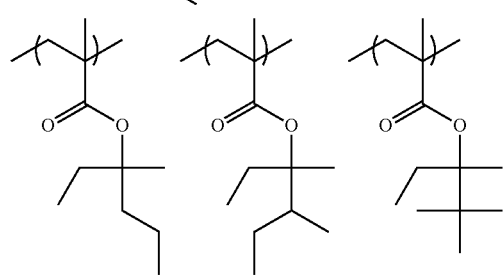
-continued
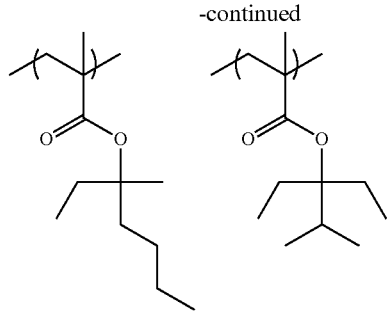
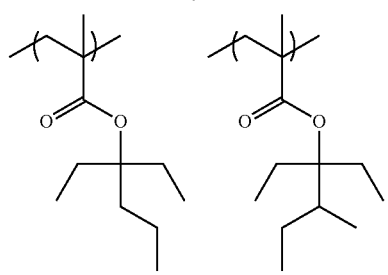
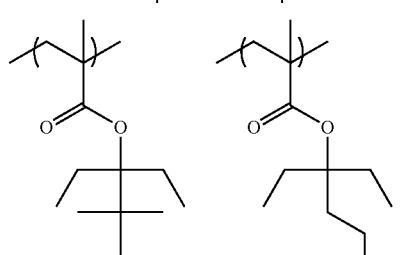
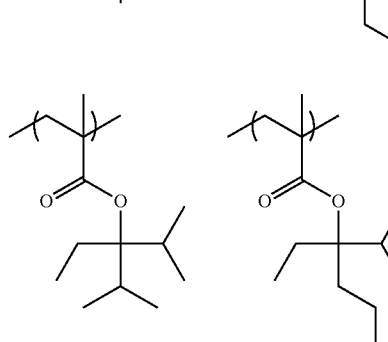
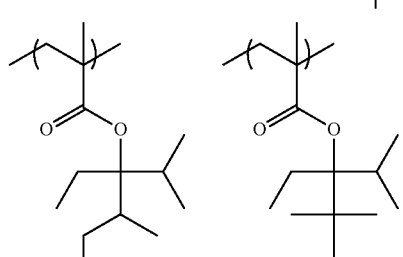
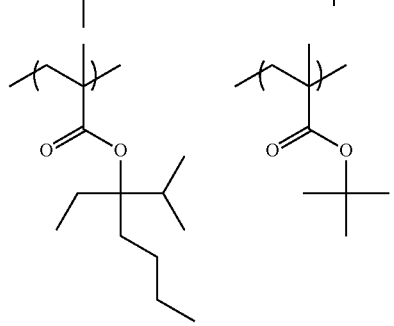

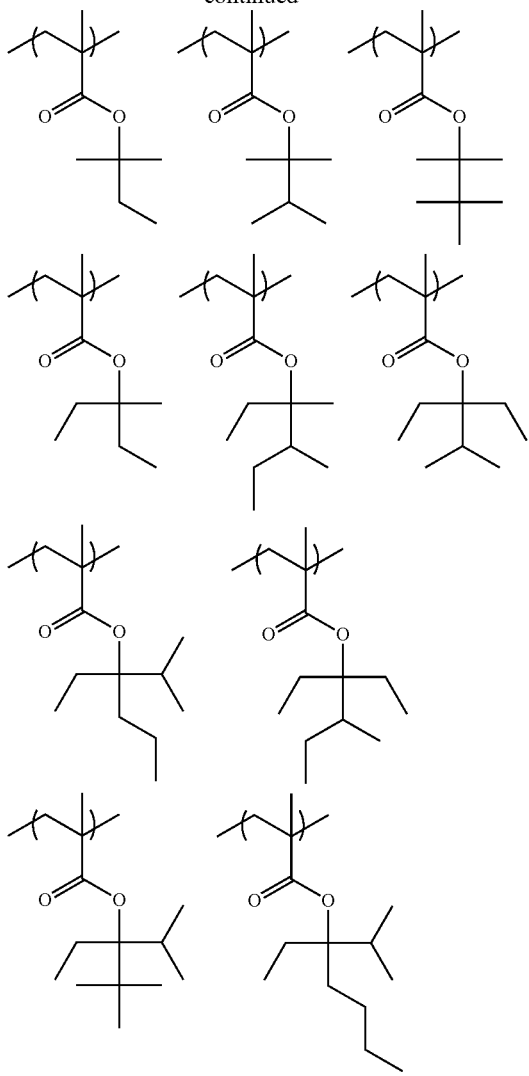

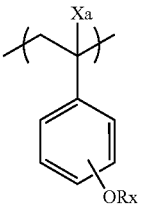

(I)

In formula (I), Xa represents a hydrogen atom or a linear or branched alkyl group.

Rx represents a hydrogen atom or a group capable of decomposing and leaving by the action of an acid.

Specific examples and preferred examples of the linear or branched alkyl group of Xa are the same as specific examples and preferred examples described above for the linear or branched alkyl group of $R_0$ in formula (III).

Specific examples and preferred examples of the group capable of decomposing and leaving by the action of an acid of Rx are the same as specific examples and preferred examples described above for the group capable of decomposing and leaving by the action of an acid, which is protecting the polar group constituting the acid-decomposable group in the resin (A).

In the resin (A) for use in the present invention, from the standpoint of enhancing the dissolution contrast by sufficiently reducing the solubility of the exposed area for an organic developer and maintaining adequate solubility of the unexposed area, the content of the repeating unit represented by formula (I) (in the case of containing a plurality of kinds of repeating units, the total thereof) is, based on all repeating units in the resin (A), preferably 10 mol % or less, more preferably 5 mol % or less, and ideally 0 mol %, that is, the resin does not contain the repeating unit. If the repeating unit represented by formula (I) is present in a ratio of 20 mol % or more based on all repeating units in the resin (A), this tends to cause excessive dissolution in an organic solvent, failing in obtaining resolution and rectangularity of the pattern.

[Repeating Unit Having Non-Phenolic Aromatic Group Other than Repeating Unit Represented by Formula (I)]

As for the repeating unit having an acid-decomposable group contained in the resin (A), one kind may be used, or two or more kinds may be used in combination.

In the resin (A) for use in the present invention, from the standpoint of enhancing the dissolution contrast by sufficiently reducing the solubility of the exposed area for an organic developer and maintaining adequate solubility of the unexposed area, the content of the repeating unit having an acid-decomposable group (preferably the repeating unit represented by formula (III)) (in the case of containing a plurality of kinds of repeating units, the total thereof) is preferably from 20 to 90 mol %, more preferably from 30 to 80 mol %, still more preferably from 40 to 70 mol %, and most preferably from 40 to 60 mol %, based on all repeating units in the resin (A).

[Repeating Unit Represented by Formula (I)]

In the present invention, the content of the repeating unit represented by the following formula (I) is less than 20 mol % based on all repeating units in the resin (A). In other words, the content is less than 20 mol % or the resin (A) does not contain the repeating unit represented by the following formula (I).

In the present invention, the resin (A) contains a repeating unit having a non-phenolic aromatic group other than the repeating unit represented by formula (I).

The "repeating unit having a non-phenolic aromatic group other than the repeating unit represented by formula (I)" as used herein indicates a repeating unit having no phenolic hydroxyl group, other than the repeating unit represented by formula (I) such as repeating unit containing an aromatic group having a phenolic hydroxyl group and repeating unit containing an aromatic group having a group derived from a phenolic hydroxyl group (for example, a group where a phenolic hydroxyl group is protected by a group capable of decomposing and leaving by the action of an acid).

The non-phenolic aromatic group may have a substituent and is preferably an aryl group having a carbon number of 6 to 10, and examples thereof include a phenyl group and a naphthyl group.

The substituent is not particularly limited as long as it is not a phenolic hydroxyl group, and examples thereof include a linear or branched alkyl group having a carbon number of 1 to 4, a cycloalkyl group having a carbon number of 3 to 10, an aryl group having a carbon number of 6 to 10, a halogen atom such as fluorine atom, a cyano group, an amino group, a nitro group, and a carboxyl group. Of these substituents, the linear or branched alkyl group having a carbon number of 1 to 4, the cycloalkyl group having a carbon number of 3 to 10, and the aryl group having a carbon number of 6 to 10 may further have a substituent, and examples of the further substituent include a halogen atom such as fluorine atom.

It is preferred that the non-phenolic aromatic group is a phenyl group and when the phenyl group has a substituent, the substituent is substituted on the 4-position of the phenyl group.

In view of etching resistance, the non-phenolic aromatic group is preferably a phenyl group which may have a substituent.

In the present invention, the repeating unit having a non-phenolic aromatic group other than the repeating unit represented by formula (I) is preferably a repeating unit represented by the following formula (II):

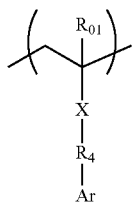

(II)

In formula (II), $R_{01}$ represents a hydrogen atom or a linear or branched alkyl group.

X represents a single bond or a divalent linking group.

Ar represents a non-phenolic aromatic group.

$R_4$ represents a single bond or an alkylene group.

Specific examples and preferred examples of the linear or branched alkyl group of $R_{01}$ are the same as specific examples and preferred examples described above for the linear or branched alkyl group of $R_0$ in formula (III).

X is preferably a divalent linking group. Preferred examples of the divalent linking group include —COO— and —CONH—.

Specific examples and preferred examples of the non-phenolic aromatic group Ar are the same as specific examples and preferred examples described above for the non-phenolic aromatic group.

The alkylene group of $R_4$ may have a substituent and is preferably an alkylene group having a carbon number of 1 to 4, and examples thereof include a methylene group, an ethylene group, and a propylene group. Examples of the substituent which the alkylene group of $R_4$ may have include an alkyl group having a carbon number of 1 to 4, and a halogen atom such as fluorine atom.

A substituent which the alkylene group of $R_4$ may have and a substituent which the non-phenolic aromatic group Ar may have may combine to form a ring, and the group forming this ring includes an alkylene group (e.g., ethylene group, propylene group).

In view of the preferred glass transition temperature (Tg) of the resin in the pattern formation, $R_4$ is preferably a single bond or a methylene group which may be substituted with a substituent.

In the resin (A) for use in the present invention, from the standpoint of enhancing the dissolution contrast by sufficiently reducing the solubility of the exposed area for an organic developer and maintaining adequate solubility of the unexposed area, the content of the repeating unit having a non-phenolic aromatic group (preferably, the repeating unit represented by formula (II)) (in the case of containing a plurality of kinds of repeating units, the total thereof) is preferably from 10 to 70 mol %, more preferably from 20 to 60 mol %, still more preferably from 30 to 50 mol %, based on all repeating units in the resin (A).

[Other Repeating Units]

The resin (A) may further contain a repeating unit having a lactone structure. The repeating unit having a lactone structure is preferably a repeating unit represented by the following formula (AII):

(AII)

In formula (AII), $Rb_0$ represents a hydrogen atom, a halogen atom or an alkyl group (preferably having a carbon number of 1 to 4) which may have a substituent.

Preferred examples of the substituent which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group formed by a combination thereof. Ab is preferably a single bond or a divalent linking group represented by -$Ab_1$-$CO_2$—.

$Ab_1$ is a linear or branched alkylene group or a monocyclic or polycyclic cycloalkylene group and is preferably a methylene group, an ethylene group, a cyclohexylene group, an adamantylene group or a norbornylene group.

V represents a group having a lactone structure.

As the group having a lactone structure, any group may be used as long as it has a lactone structure, but a 5- to 7-membered ring lactone structure is preferred, and a 5- to 7-membered ring lactone structure to which another ring structure is fused to form a bicyclo or Spiro structure is preferred. It is more preferred to contain a repeating unit having a lactone structure represented by any one of the following formulae (LC1-1) to (LC1-17). The lactone structure may be bonded directly to the main chain. Among these lactone structures, (LC1-1), (LC1-4), (LC1-5), (LC1-6), (LC1-8), (LC1-13) and (LC1-14) are preferred.

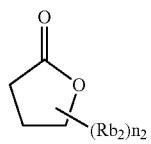

LC1-1

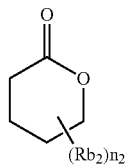

LC1-2

LC1-3 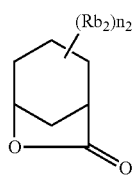

LC1-4 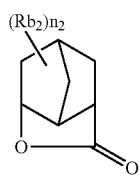

LC1-5 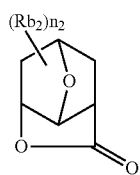

LC1-6 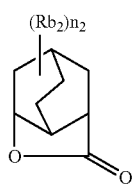

LC1-7 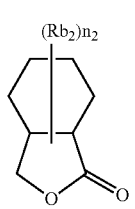

LC1-8 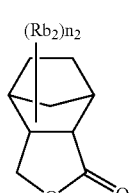

LC1-9 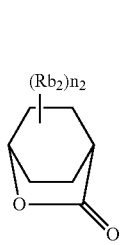

LC1-10 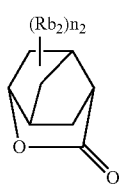

LC1-11 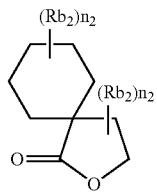

LC1-12 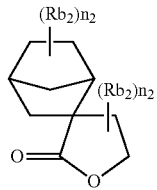

LC1-13 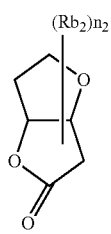

LC1-14 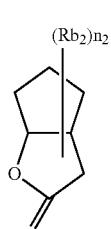

LC1-15 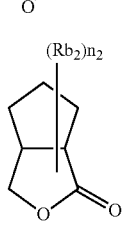

LC1-16 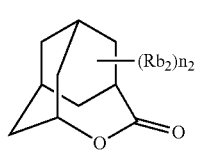

LC1-17 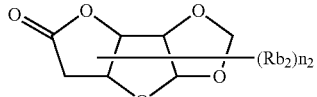

The lactone structure moiety may or may not have a substituent ($Rb_2$). Preferred examples of the substituent ($Rb_2$) include an alkyl group having a carbon number of 1 to 8, a monovalent cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. $n_2$ represents an integer of 0 to 4. When $n_2$ is 2 or more, each substituent ($Rb_2$) may be the same as or different from every other substituents (Rb$_2$) and also, the plurality of substituents (Rb$_2$) may combine together to form a ring.

The repeating unit having a lactone group usually has an optical isomer, and any optical isomer may be used. One optical isomer may be used alone or a mixture of a plurality of optical isomers may be used. In the case of mainly using one optical isomer, the optical purity (ee) thereof is preferably 90% or more, more preferably 95% or more.

The resin (A) may or may not contain the repeating unit having a lactone structure, but in the case of containing the repeating unit having a lactone structure, the content thereof in the resin (A) is preferably from 0.5 to 50 mol %, more preferably from 1 to 40 mol %, still more preferably from 3 to 30 mol %, based on all repeating units. As for this repeating unit, one kind of a repeating unit may be used, or two or more kinds of repeating units may be used in combination. By virtue of using a specific lactone structure, the resolution of the pattern is enhanced and the rectangular profile is improved.

Specific examples of the repeating unit having a lactone structure in the resin (A) are illustrated below, but the present invention is not limited thereto. In the formulae, Rx represents H, CH$_3$, CH$_2$OH or CF$_3$.

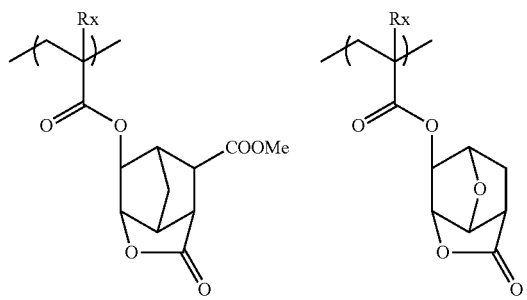
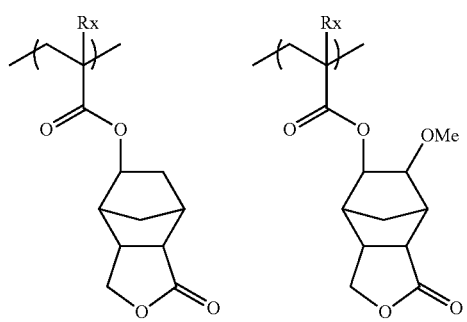
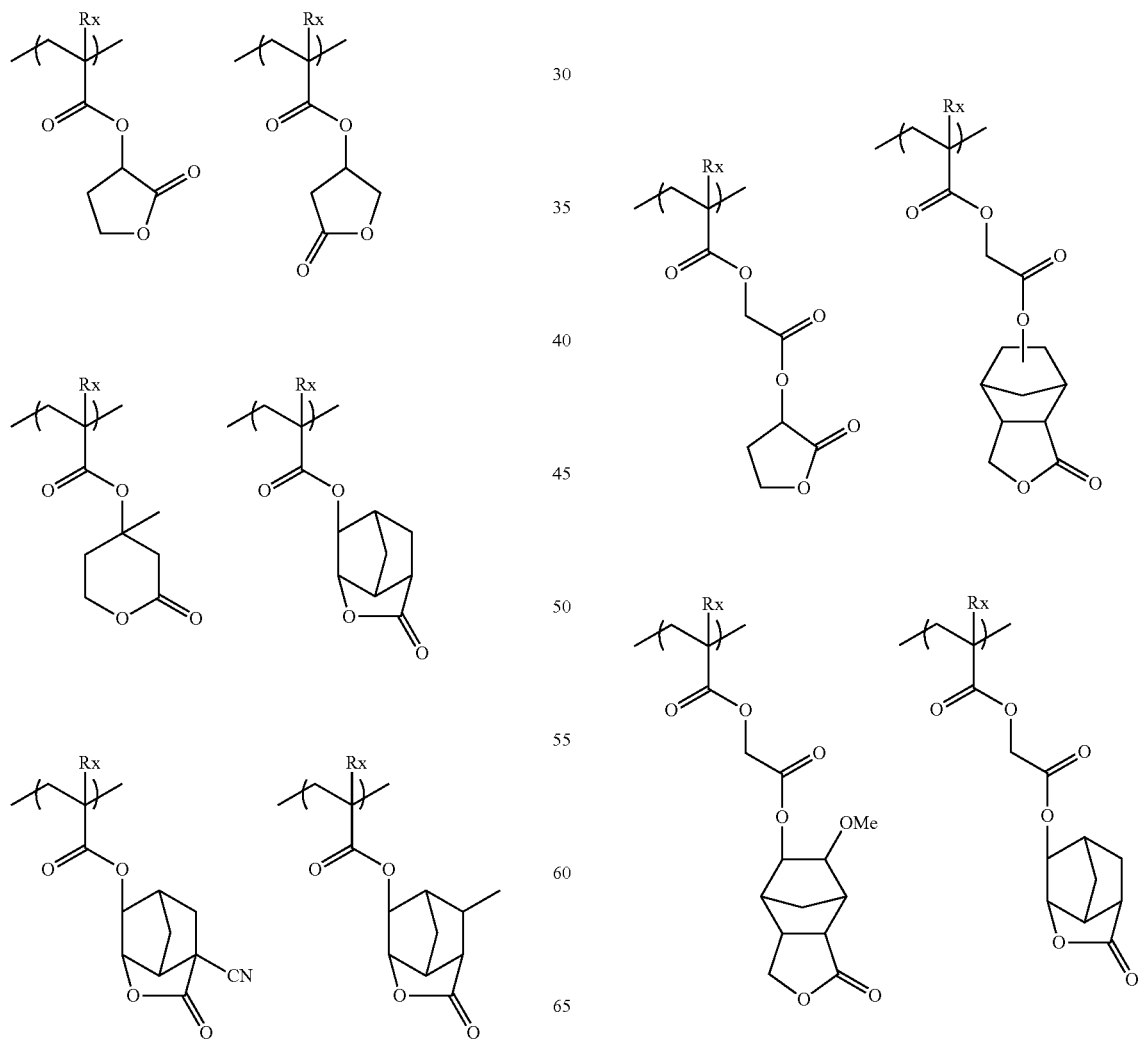
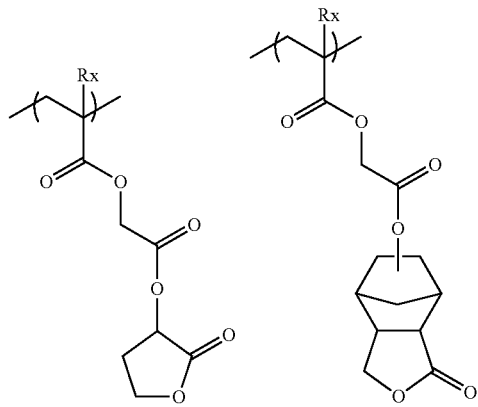
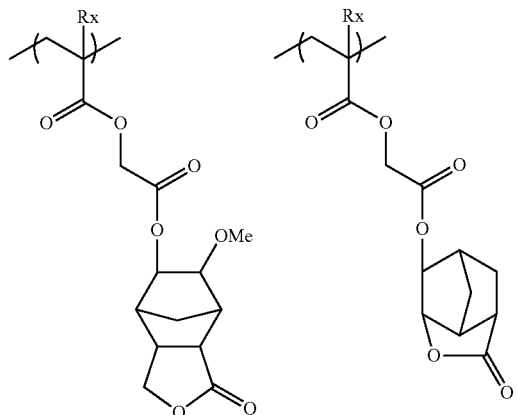

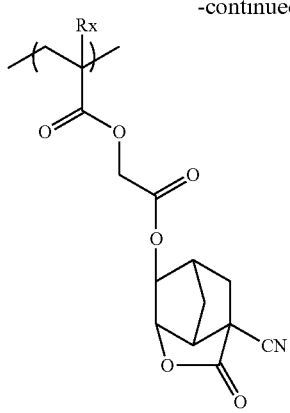

The resin (A) may contain a repeating unit having an acid group. The acid group includes a carboxyl group, a sulfonamide group, a sulfonylimide group, a bissulfonylimide group, and an aliphatic alcohol substituted with an electron-withdrawing group at the α-position (for example, a hexafluoroisopropanol group), and it is more preferred to contain a repeating unit having a carboxyl group. By virtue of containing a repeating unit having an acid group, the resolution increases, for example, in the usage of forming contact holes. As for the repeating unit having an acid group, a repeating unit where the acid group is directly bonded to the main chain of the resin, such as repeating unit by an acrylic acid or a methacrylic acid, a repeating unit where the acid group is bonded to the main chain of the resin through a linking group, and a repeating unit where the acid group is introduced into the terminal of the polymer chain by using an acid group-containing polymerization initiator or chain transfer agent at the polymerization, all are preferred. The linking group may have a monocyclic or polycyclic, cyclic hydrocarbon structure. A repeating unit by an acrylic acid or a methacrylic acid is more preferred.

Specific examples of the repeating unit having an acid group are illustrated below, but the present invention is not limited thereto.

In specific examples, Rx represents H, CH$_3$, CH$_2$OH or CF$_3$.

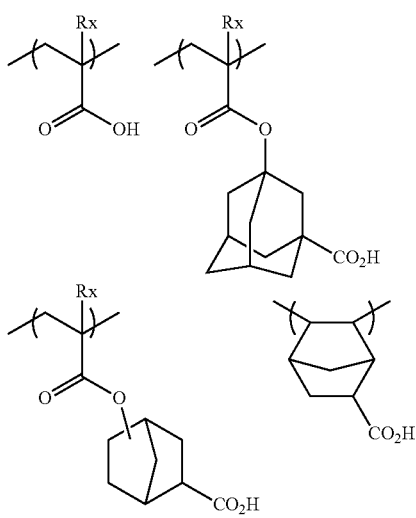

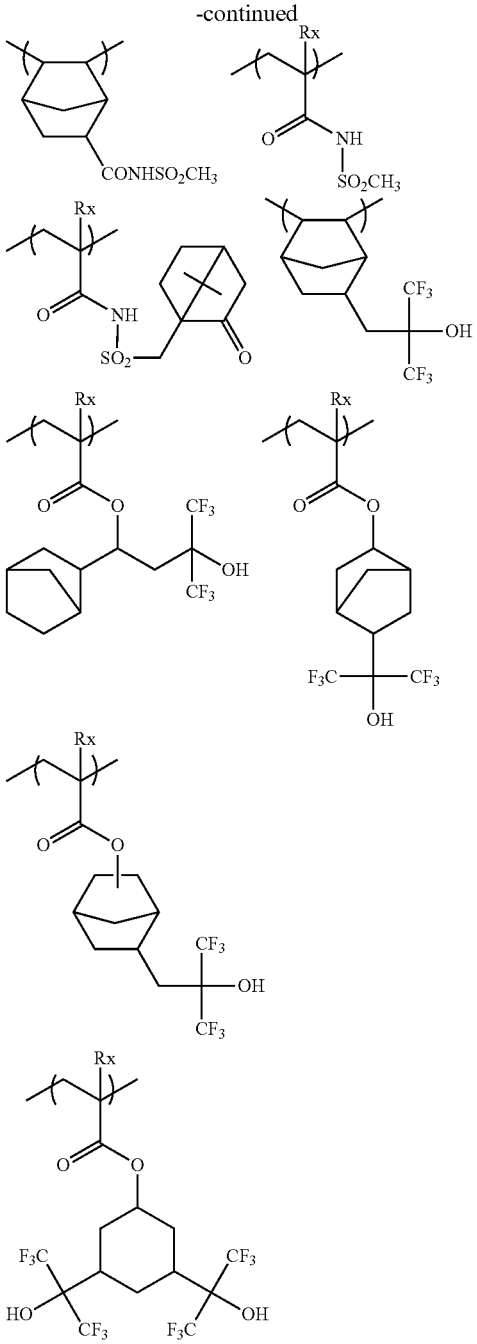

The resin (A) may or may not contain a repeating unit having an acid group, but in the case where the resin (A) contains a repeating unit having an acid group, the content of the repeating unit is preferably from 1 to 25 mol %, more preferably from 1 to 20 mol %, still more preferably from 3 to 15 mol %, based on all repeating units in the resin (A).

The resin (A) may further contain a repeating unit having a hydroxyl group or a cyano group, which is a repeating unit other than the above-described repeating units. Thanks to this repeating unit, adherence to substrate and affinity for developer can be enhanced. The repeating unit having a hydroxyl group or a cyano group is preferably a repeating unit having an alicyclic hydrocarbon structure substituted with a hydroxyl group or a cyano group and preferably has no acid-decomposable group. The alicyclic hydrocarbon structure in the alicyclic hydrocarbon structure substituted with a hydroxyl group or a cyano group is preferably an adamantyl group, a diamantyl group or a norbornane group, more preferably an adamantyl group. The alicyclic hydrocarbon structure is preferably substituted with a hydroxyl group, and it is more preferred to contain a repeating unit having an adamantyl group substituted with at least one hydroxyl group.

In particular, from the standpoint of restraining the diffusion of the acid generated, the resin (A) most preferably contains a repeating unit having a hydroxyadamantyl group or a dihydroxyadamantyl group. The alicyclic hydrocarbon structure substituted with a hydroxyl group or a cyano group is preferably a partial structure represented by the following formulae (VIIa) to (VIId), more preferably a partial structure represented by the following formula (VIIa):

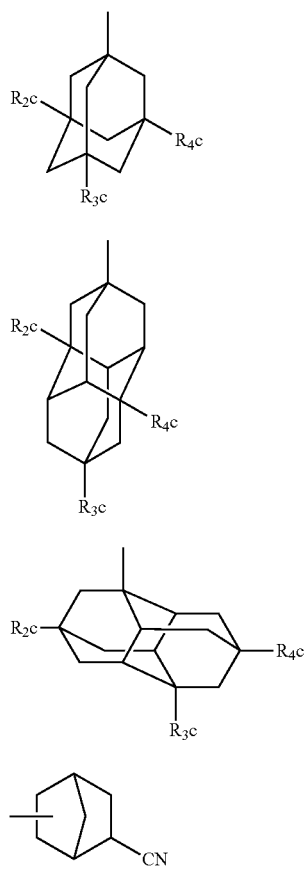

In formulae (VIIa) to (VIIc), each of $R_2c$ to $R_4c$ independently represents a hydrogen atom, a hydroxyl group or a cyano group. However, at least one of $R_2c$ to $R_4c$ represents a hydroxyl group or a cyano group. A structure in which one or two members out of $R_2c$ to $R_4c$ are a hydroxyl group with the remaining being a hydrogen atom is preferred. In formula (VIIa), it is more preferred that two members out of $R_2c$ to $R_4c$ are a hydroxyl group and the remaining is a hydrogen atom.

The repeating unit having a partial structure represented by formulae (VIIa) to (VIId) includes repeating units represented by the following formulae (AIIa) to (AIId):

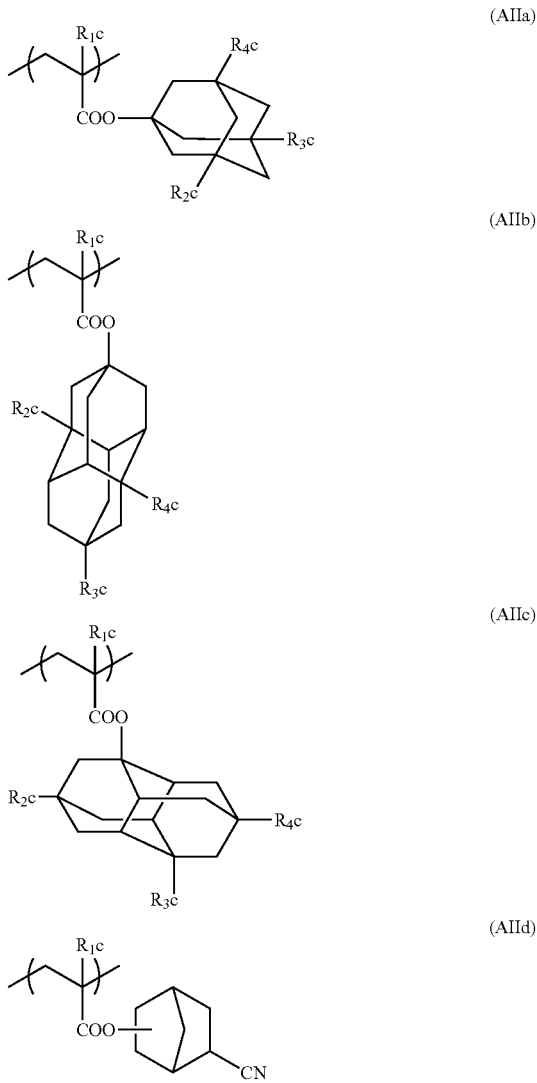

In formulae (AIIa) to (AIId), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

Specific examples of the repeating unit having a hydroxyl group or a cyano group are illustrated below, but the present invention is not limited thereto.

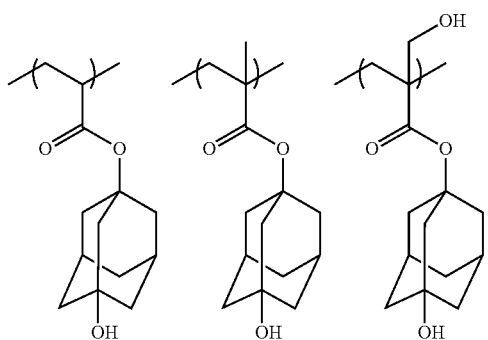

-continued

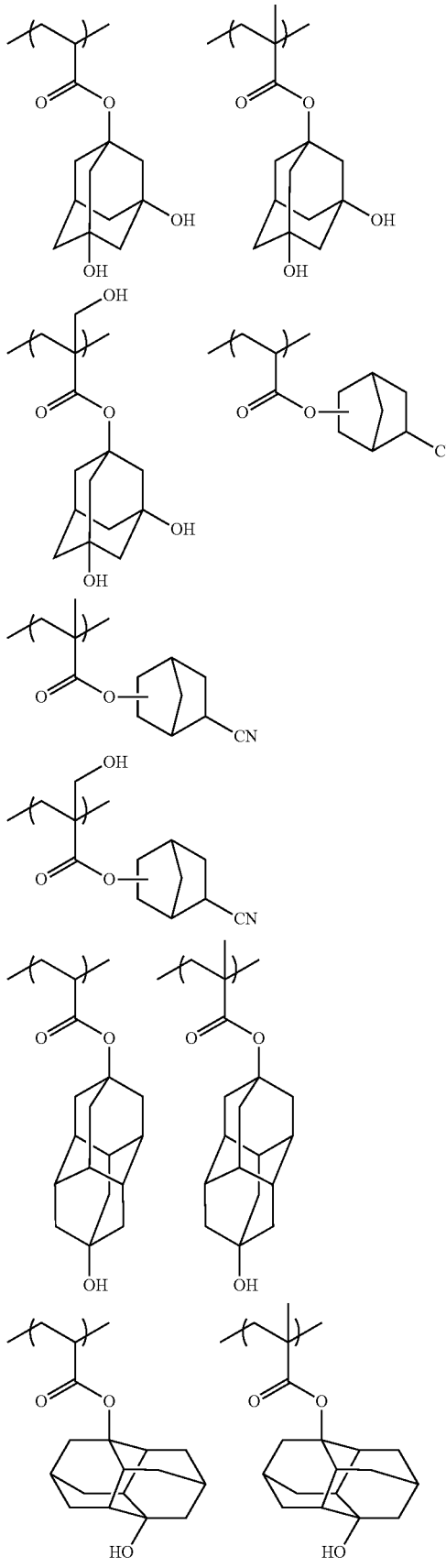

The resin (A) may or may not contain the repeating unit having a hydroxyl group or a cyano group, but in the case where the resin (A) contains the repeating unit having a hydroxyl group or a cyano group, the content of the repeating unit is preferably from 1 to 40 mol %, more preferably from 1 to 30 mol %, still more preferably from 3 to 20 mol %, based on all repeating units in the resin (A).

The resin (A) for use in the present invention may further contain a repeating unit having an alicyclic hydrocarbon structure free from a polar group (for example, the above-described acid group, a hydroxyl group or a cyano group) and not exhibiting acid decomposability. Thanks to this repeating unit, the solubility of the resin at the development using an organic solvent-containing developer can be appropriately adjusted. Such a repeating unit includes a repeating unit represented by formula (IV):

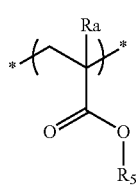

(IV)

In formula (IV), $R_5$ represents a hydrocarbon group having at least one cyclic structure and having no polar group.

Ra represents a hydrogen atom, an alkyl group, or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring assembly hydrocarbon group and a crosslinked cyclic hydrocarbon group. Examples of the ring assembly hydrocarbon group include a bicyclohexyl group and a perhydronaphthalenyl group. Examples of the crosslinked cyclic hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.0$^{2,6}$]decane ring and tricyclo[4.3.1.1$^{2,5}$]undecane ring, and a tetracyclic hydrocarbon ring such as tetracyclo[4.4.0.1$^{2,5}$.1$^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by fusing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group and a tricycle[5,2,1,0$^{2,6}$]decanyl group. Of these crosslinked cyclic hydrocarbon rings, a norbornyl group and an adamantyl group are more preferred.

These alicyclic hydrocarbon groups may have a substituent, and preferred examples of the substituent include a halogen atom, an alkyl group, a hydroxyl group with a hydrogen atom being substituted for, and an amino group with a hydrogen atom being substituted for. The halogen atom is preferably bromine atom, chlorine atom or fluorine atom, and the alkyl group is preferably methyl group, ethyl group, butyl group or tert-butyl group. This alkyl group may further have a substituent, and the substituent which the alkyl group may have includes a halogen atom, an alkyl group, a hydroxyl group with a hydrogen atom being substituted for, and an amino group with a hydrogen atom being substituted for.

Examples of the substituent for hydrogen atom include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group includes, for example, an alkoxycarbonyl group having a carbon number of 1 to 4.

The resin (A) may or may not contain a repeating unit having a polar group-free alicyclic hydrocarbon structure and not exhibiting acid decomposability, but in the case where the resin (A) contains a repeating unit having a polar group-free alicyclic hydrocarbon structure and not exhibiting acid decomposability, the content of the repeating unit is preferably from 1 to 40 mol %, more preferably from 1 to 20 mol %, based on all repeating units in the resin (A).

Specific examples of the repeating unit having a polar group-free alicyclic hydrocarbon structure and not exhibiting acid decomposability are illustrated below, but the present invention is not limited thereto. In the formulae, Ra represents H, CH$_3$, CH$_2$OH or CF$_3$.

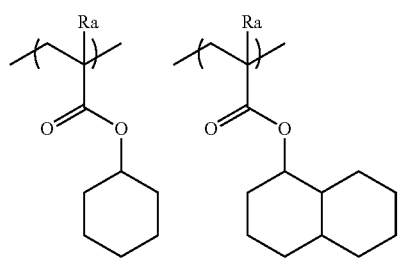

-continued

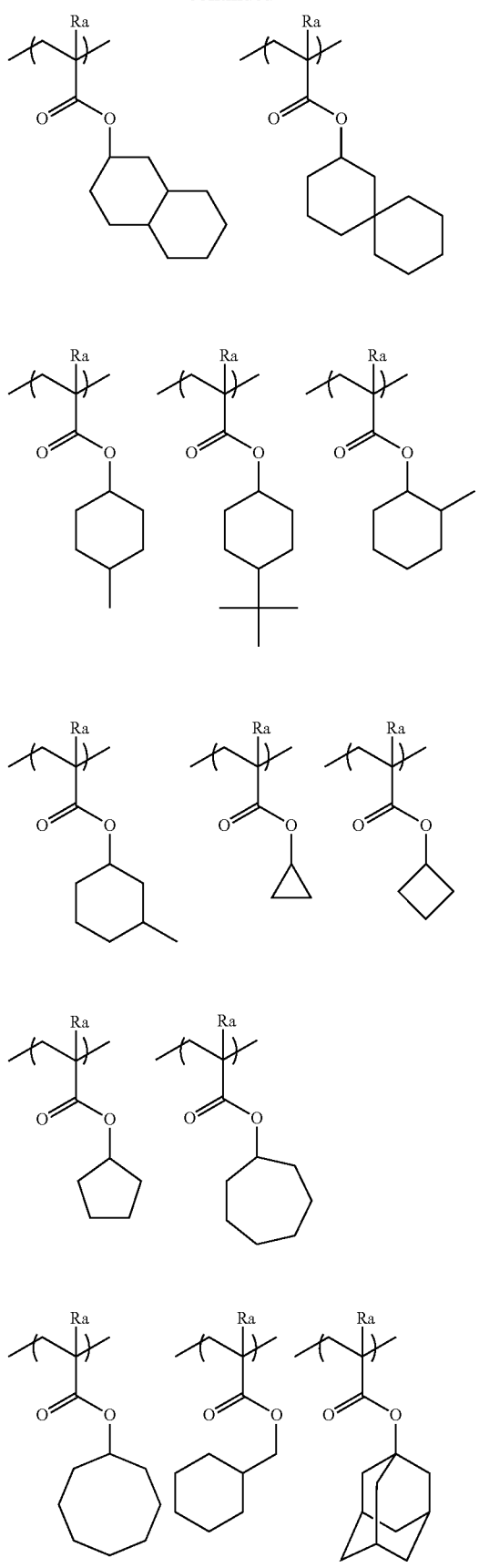

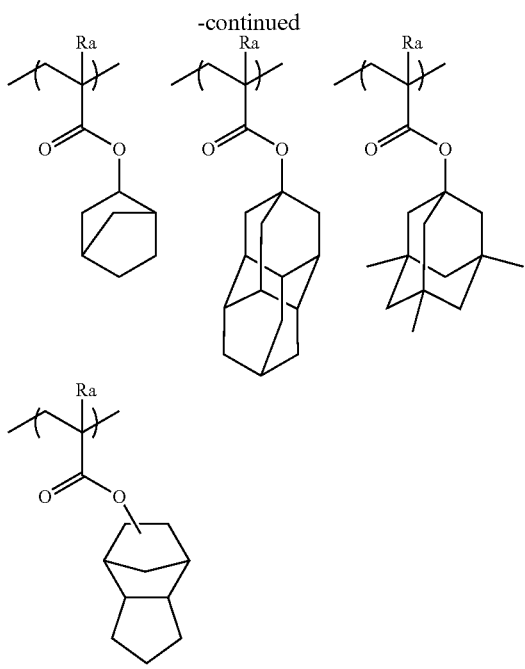

The resin (A) for use in the composition of the present invention may contain, in addition to the above-described repeating structural units, various repeating structural units for the purpose of controlling the dry etching resistance, suitability for standard developer, adherence to substrate, resist profile and properties generally required of an actinic ray-sensitive or radiation-sensitive resin composition, such as resolution, heat resistance and sensitivity.

Examples of such a repeating structural unit include, but are not limited to, repeating structural units corresponding to the monomers described below.

Thanks to such a repeating structural unit, the performance required of the resin for use in the composition of the present invention, particularly
 (1) solubility for coating solvent,
 (2) film-forming property (glass transition temperature),
 (3) alkali developability,
 (4) film loss (selection of hydrophilic, hydrophobic or alkali-soluble group),
 (5) adherence of unexposed area to substrate,
 (6) dry etching resistance, and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers, vinyl esters, styrenes and crotonic acid esters.

Other than these, an addition-polymerizable unsaturated compound copolymerizable with the monomers corresponding to the above-described various repeating structural units may be copolymerized.

In the resin (A) for use in the composition of the present invention, the molar ratio of respective repeating structural units contained is appropriately set to control the dry etching resistance of actinic ray-sensitive or radiation-sensitive resin composition, the suitability for standard developer, the adherence to substrate, the resist profile and the performances generally required of a resist, such as resolution, heat resistance and sensitivity.

The form of the resin (A) for use in the present invention may be any of random type, block type, comb type and star type. The resin (A) can be synthesized, for example, by radical, cationic or anionic polymerization of unsaturated monomers corresponding to respective structures. It is also possible to obtain the target resin by polymerizing unsaturated monomers corresponding to precursors of respective structures and then performing a polymer reaction.

The resin (A) for use in the present invention can be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the actinic ray-sensitive or radiation-sensitive resin composition of the present invention. By the use of the same solvent, production of particles during storage can be suppressed.

The polymerization reaction is preferably performed in an inert gas atmosphere such as nitrogen or argon. As for the polymerization initiator, the polymerization is started using a commercially available radical initiator (such as azo-based initiator and peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is poured in a solvent, and the desired polymer is collected by a powder or solid recovery method or the like. The reaction concentration is from 5 to 50 mass %, preferably from 10 to 30 mass %, and the reaction temperature is usually from 10 to 150° C., preferably from 30 to 120° C., more preferably from 60 to 100° C. (In this specification, mass ratio is equal to weight ratio.)

After the completion of reaction, the reaction solution is allowed to cool to room temperature and purified. The purification may be performed by a normal method, for example, a liquid-liquid extraction method of applying water washing or combining it with an appropriate solvent to remove residual monomers or oligomer components; a purification method in a solution sate, such as ultrafiltration of removing by extraction only polymers having a molecular weight not more than a specific value; a reprecipitation method of adding dropwise the resin solution in a poor solvent to solidify the resin in the poor solvent and thereby remove residual monomers and the like; and a purification method in a solid state, such as washing of the resin slurry with a poor solvent after separation by filtration. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent for the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing such a solvent, and the like, according to the kind of the polymer.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably at a temperature of approximately from 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a solid resin (step d), and separating the precipitated resin (step e).

Also, for keeping the resin from aggregation or the like after preparation of the composition, as described, for example, in JP-A-2009-037108, a step of dissolving the synthesized resin in a solvent to make a solution, and heating the solution at approximately from 30 to 90° C. for approximately from 30 minutes to 4 hours may be added.

The weight average molecular weight of the resin (A) for use in the composition of the present invention is preferably from 1,000 to 200,000, more preferably from 2,000 to 100,000, still more preferably from 3,000 to 70,000, yet still more preferably from 5,000 to 50,000, in terms of polystyrene by the GPC method. When the weight average molecular weight is from 1,000 to 200,000, reduction in the heat resistance and dry etching resistance can be avoided and at the same time, the film-forming property can be prevented from deterioration due to impaired developability or increased viscosity.

The polydispersity (molecular weight distribution) is usually from 1.0 to 3.0, preferably from 1.0 to 2.6, more preferably from 1.2 to 2.4, still more preferably from 1.4 to 2.2. When the molecular weight distribution satisfies the range above, the resolution and resist profile are excellent, the side wall of the resist pattern is smooth, and the roughness is improved.

In the actinic ray-sensitive or radiation-sensitive resin composition of the present invention, the content of the resin (A) in the entire composition is preferably from 30 to 99 mass %, more preferably from 60 to 95 mass %, based on the entire solid content.

In the present invention, as for the resin (A), one kind of a resin may be used or a plurality of kinds of resins may be used in combination The actinic ray-sensitive or radiation-sensitive resin composition according to the present invention may further contain, together with the resin (A), an acid-decomposable resin (a resin capable of increasing the polarity by the action of an acid to reduce the solubility for an organic solvent-containing developer) other than the resin (A). The acid-decomposable resin other than the resin (A) is an acid-decomposable resin composed of the same repeating units as the repeating units which may be contained in the resin (A), and preferred ranges of the repeating units and the contents thereof in the resin are the same as those described for the resin (A).

In the case of containing an acid-decomposable resin other than the resin (A), the content of the acid-decomposable resin in the composition according to the present invention may be sufficient if the total of the contents of the resin (A) and the acid-decomposable resin other than the resin (A) falls in the range above. The mass ratio between the resin (A) and the acid-decomposable resin other than the resin (A) may be appropriately adjusted within the range where the effects of the present invention are successfully provided, but the ratio [resin (A)/acid-decomposable resin other than resin (A)] is preferably from 99.9/0.1 to 10/90, more preferably from 99.9/0.1 to 60/40.

From the standpoint of offering high resolution and rectangular profile of the resist pattern and imparting etching resistance at dry etching, the actinic ray-sensitive or radiation-sensitive resin composition according to the present invention preferably contains only the resin (A) as the acid-decomposable resin.

[2] (B) Compound Capable of Generating an Organic Acid Upon Irradiation with an Actinic Ray or Radiation The actinic ray-sensitive or radiation-sensitive resin composition of the present invention contains (B) a compound capable of generating an organic acid upon irradiation with an actinic ray or radiation (hereinafter, sometimes referred to as an "acid generator (B)"). The acid generator (B) which can be used may be appropriately selected from a photo-initiator for cationic photopolymerization, a photo-initiator for radical photopolymerization, a photo-decoloring agent for dyes, a photo-discoloring agent, a known compound capable of generating an acid upon irradiation with an actinic ray or radiation, which is used for microresist or the like, and a mixture thereof.

Examples thereof include a diazonium salt, a phosphonium salt, a sulfonium salt, an iodonium salt, imidosulfonate, oxime sulfonate, diazodisulfone, disulfone and o-nitrobenzyl sulfonate. The acid generator (B) preferably contains a sulfonium salt or an iodonium salt.

Also, a compound where a group or compound capable of generating an acid upon irradiation with an actinic ray or radiation is introduced into the main or side chain of the polymer, for example, the compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, the compounds capable of generating an acid by the effect of light described, for example, in U.S. Pat. No. 3,779,778 and European Patent 126,712 may be used.

Out of the compounds capable of decomposing upon irradiation with an actinic ray or radiation to generate an acid, which are the acid generator (B), preferred compounds include compounds represented by the following formulae (ZI), (ZII) and (ZIII):

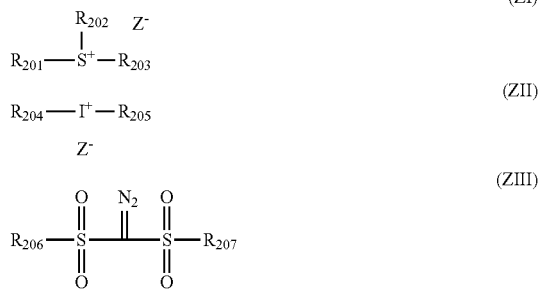

In formula (ZI), each of $R_{201}$, $R_{202}$ and $R_{203}$ independently represents an organic group.

$Z^-$ represents a non-nucleophilic anion, and preferred examples thereof include a sulfonate anion, a bis(alkylsulfonyl)amide anion, a tris(alkylsulfonyl)methide anion, $BF_4^-$, $PF_6^-$ and $SbF_6^-$. An organic anion containing a carbon atom is preferred. As the organic anion, preferred are organic anions represented by the following formulae AN1 to AN3:

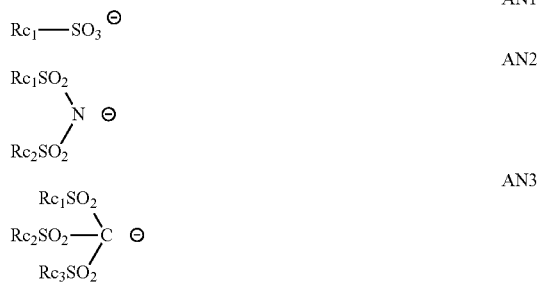

In formulae AN1 to AN3, each of $Rc_1$ to $Rc_3$ independently represents an organic group. The organic group of $Rc_1$ to $Rc_3$ includes an organic group having a carbon number of 1 to 30 and is preferably an alkyl group which may be substituted, a monocyclic or polycyclic cycloalkyl group, a heteroatom-containing cyclic group, an aryl group, or a group formed by connecting a plurality of these groups through a linking group such as single bond, —O—, —CO$_2$—, —S—, —SO$_3$— and —SO$_2$N(Rd$_1$)-. The organic group may form a ring structure together with another alkyl group or aryl group bonded thereto.

$Rd_1$ represents a hydrogen atom or an alkyl group and may form a ring structure together with an alkyl group or aryl group bonded thereto.

The organic group of $Rc_1$ to $Rc_3$ may be an alkyl group substituted with a fluorine atom or a fluoroalkyl group at the 1-position, or a phenyl group substituted with a fluorine atom or a fluoroalkyl group. By virtue of containing a fluorine atom or a fluoroalkyl group, the acidity of the acid generated upon irradiation with fight is increased and in turn, the sensitivity is enhanced. When each of $Rc_1$ to $Rc_3$ has 5 or more carbon atoms, at least one carbon atom is preferably substituted with a hydrogen atom, and it is more preferred that the number of hydrogen atoms is larger than the number of fluorine atoms. Thanks to the absence of a perfluoroalkyl group having a carbon number of 5 or more, the toxicity to ecology is reduced.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group.

Examples of the group formed by combining two members out of $R_{201}$ to $R_{203}$ include an alkylene group (e.g., butylenes group, pentylene group).

Specific examples of the organic group as $R_{201}$, $R_{202}$ and $R_{203}$ include the corresponding groups in the later-described compounds (ZI-1) and (ZI-2).

The compound may be a compound having a plurality of structures represented by formula (ZI). For example, the compound may be a compound having a structure where at least one of $R_{201}$ to $R_{203}$ in a compound represented by formula (ZI) is bonded to at least one of $R_{201}$ to $R_{203}$ in another compound represented by formula (ZI).

Compounds (ZI-1) and (ZI-2) described below are more preferred as the component (ZI).

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group.

Examples of the arylsulfonium compound include a triarylsulfonium compound, a diarylalkylsulfonium compound, and an aryldialkylsulfonium compound.

The aryl group in the arylsulfonium compound is preferably an aryl group such as phenyl group, naphthyl group and fluorene group, or a heteroaryl group such as indole residue and pyrrole residue, more preferably a phenyl group or an indole residue. In the case where the arylsulfonium compound has two or more aryl groups, these two or more aryl groups may be the same or different.

The alkyl group which is present, if desired, in the arylsulfonium compound is preferably a linear, branched or cyclic alkyl group having a carbon number of 1 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group and alkyl group as $R_{201}$ to $R_{203}$ may have, as the substituent, an alkyl group (for example, having a carbon number of 1 to 15), an aryl group (for example, having a carbon number of 6 to 14), an alkoxy group (for example, having a carbon number of 1 to 15), a halogen atom, a hydroxyl group or a phenylthio group. The substituent is preferably a linear, branched or cyclic alkyl group having a carbon number of 1 to 12, or a linear, branched or cyclic alkoxy group having a carbon number of 1 to 12, and most preferably an alkyl group having a carbon number of 1 to 4, or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted on the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein encompasses an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ is independently, preferably an alkyl group, a cycloalkyl group, a 2-oxoalkyl group, a 2-oxocycloalkyl group, an alkoxycarbonylmethyl group, an allyl group or a vinyl group, more preferably a linear or branched 2-oxoalkyl group, a 2-oxocycloalkyl group or an alkoxycarbonylmethyl group, and most preferably a linear or branched 2-oxoalkyl group.

The alkyl group and cycloalkyl group as $R_{201}$ to $R_{203}$ are preferably a linear or branched alkyl group having a carbon number of 1 to 10 (e.g., methyl group, ethyl group, propyl group, butyl group, pentyl group), and a cycloalkyl group having a carbon number of 3 to 10 (e.g., cyclopentyl group, cyclohexyl group, norbornyl group).

The 2-oxoalkyl group as $R_{201}$ to $R_{203}$ may be either linear or branched and is preferably a group having >C=O at the 2-position of the above-described alkyl group.

The 2-oxocycloalkyl group as $R_{201}$ to $R_{203}$ is preferably a group having >C=O at the 2-position of the above-described cycloalkyl group.

The alkoxy group in the alkoxycarbonylmethyl group as $R_{201}$ to $R_{203}$ is preferably an alkoxy group having a carbon number of 1 to 5 (e.g., methoxy group, ethoxy group, propoxy group, butoxy group, pentoxy group).

$R_{201}$ to $R_{203}$ may be further substituted with a halogen atom, an alkoxy group (for example, having a carbon number of 1 to 5), a hydroxyl group, a cyano group or a nitro group.

Two members out of $R_{201}$ to $R_{203}$ may combine to form a ring structure, and the ring may contain an oxygen atom, a sulfur atom, an ester bond, an amide bond or a carbonyl group. The group formed by combining two members out of $R_{201}$ to $R_{203}$ includes an alkylene group (e.g., butylene group, pentylene group).

Formulae (ZII) and (ZIII) are described below.

In formulae (ZII) and (ZIII), each of $R_{204}$ to $R_{207}$ independently represents an aryl group which may have a substituent, an alkyl group which may have a substituent, or a cycloalkyl group which may have a substituent.

Specific examples and preferred examples of the aryl group of $R_{204}$ to $R_{207}$ are the same as those described for the aryl group of $R_{201}$ to $R_{203}$ in the compound (ZI-1).

Specific examples and preferred examples of the alkyl group and cycloalkyl group of $R_{204}$ to $R_{207}$ are the same as those described for the linear, branched or cyclic alkyl group of $R_{201}$ to $R_{203}$ in the compound (ZI-2).

$Z^-$ has the same meaning as $Z^-$ in formula (ZI).

Out of the compounds capable of generating an acid upon irradiation with an actinic ray or radiation, which are the acid generator (B), preferred compounds further include compounds represented by the following formulae (ZIV), (ZV) and (ZVI):

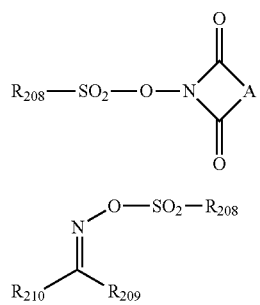

In formulae (ZIV) to (ZVI), each of $Ar_3$ and $Ar_4$ independently represents a substituted or unsubstituted aryl group.

Each $R_{208}$ in formulae (ZV) and (ZVI) independently represents a substituted or unsubstituted alkyl group, a substituted or unsubstituted cycloalkyl group, or a substituted or unsubstituted aryl group. In view of increasing the strength of the acid generated, $R_{208}$ is preferably substituted with a fluorine atom.

Each of $R_{209}$ and $R_{210}$ independently represents a substituted or unsubstituted alkyl group, a substituted or unsubstituted cycloalkyl group, a substituted or unsubstituted aryl group, an alkylthio group or an electron-withdrawing group.

$R_{209}$ and $R_{210}$ may combine to form a ring structure. The ring structure may contain an oxygen atom, a sulfur atom, an alkylene group, an alkenylene group, an arylene group or the like.

$R_{209}$ is preferably a substituted or unsubstituted aryl group. $R_{210}$ is preferably an electron-withdrawing group, more preferably a cyano group or a fluoroalkyl group.

A represents a substituted or unsubstituted alkylene group, a substituted or unsubstituted cycloalkylene group, a substituted or unsubstituted alkenylene group, or a substituted or unsubstituted arylene group.

Specific examples of the aryl group of $Ar_3$, $Ar_4$, $R_{208}$, $R_{209}$ and $R_{210}$ are the same as specific examples of the aryl group of $R_{201}$ to $R_{203}$ in formula (ZI-1).

Specific examples of the alkyl group and cycloalkyl group of $R_{208}$, $R_{209}$ and $R_{210}$ are the same as specific examples of the alkyl group and cycloalkyl group of $R_{201}$ to $R_{203}$ in formula (ZI-2).

Examples of the alkyl moiety in the alkylthio group of $R_{209}$ and $R_{210}$ are the same as specific examples of the alkyl group of $R_{201}$ to $R_{203}$ in formula (ZI-2).

The alkylene group of A includes an alkylene group having a carbon number of 1 to 12 (e.g., methylene group, ethylene group, propylene group, isopropylene group, butylenes group, isobutylene group); the cycloalkylene group of A includes a monocyclic or polycyclic cycloalkylene group having a carbon number of 3 to 12 (e.g., cyclohexylene group, norbornylene group, adamantylene group); the alkenylene group of A includes an alkenylene group having a carbon number of 2 to 12 (e.g., ethenylene group, propenylene group, butenylene group); and the arylene group of A includes an arylene group having a carbon number of 6 to 10 (e.g., phenylene group, tolylene group, naphthylene group).

In the present invention, a compound having a plurality of structures represented by formula (ZVI) is also preferred. For example, the compound may be a compound having a structure where either $R_{209}$ or $R_{210}$ in a compound represented by formula (ZVI) is bonded to either $R_{209}$ or $R_{210}$ in another compound represented by formula (ZVI).

Among the compounds capable of decomposing upon irradiation with an actinic ray or radiation to generate an acid, the compound preferred as the acid generator (B) is a compound represented by formulae (ZIII) to (ZVI), that is, a nonionic compound, because of good solubility of the unexposed area for an organic solvent-containing developer and little production of a development defect, and more preferably a compound represented by formula (ZV) or (ZVI).

Also, from the standpoint of enhancing the acid generation efficiency and the acid strength, the acid generator (B) preferably has a structure capable of generating an acid containing a fluorine atom.

Specific examples of the acid generator (B) are illustrated below, but the present invention is not limited thereto.

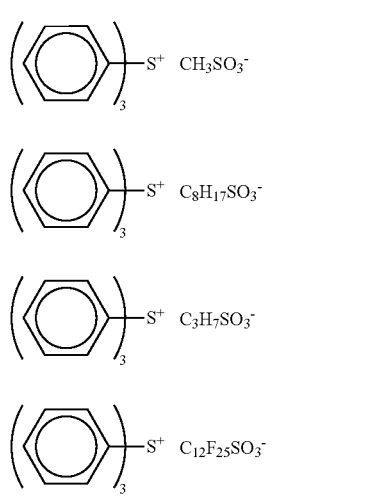

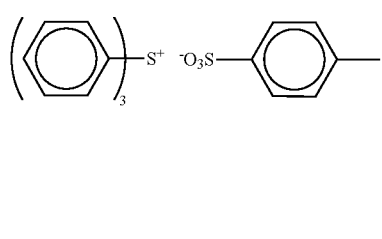

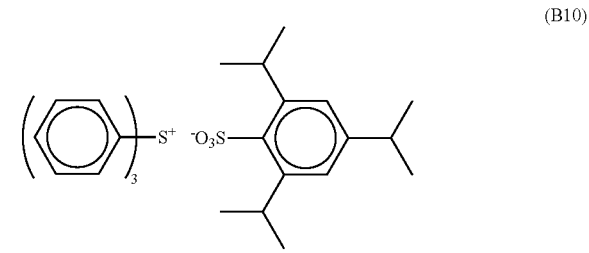

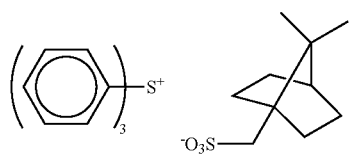

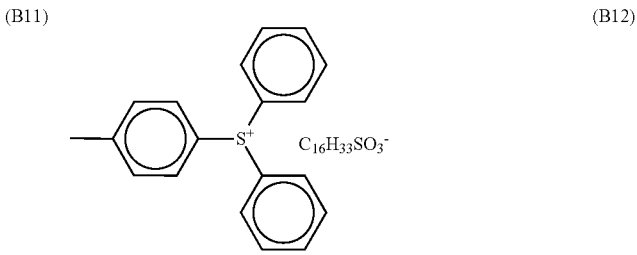

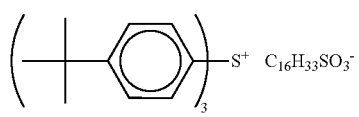

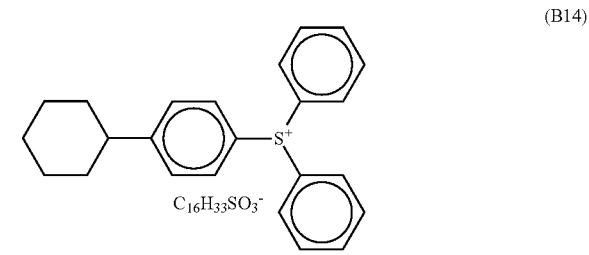

-continued
(B15) 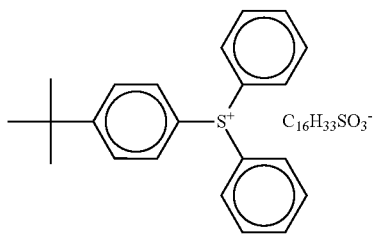
(B16) 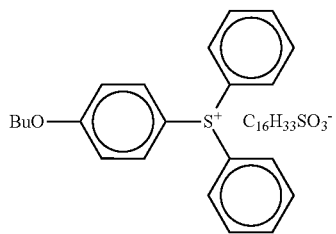
(B17) 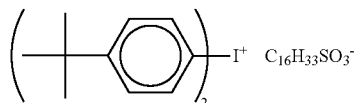
(B18) 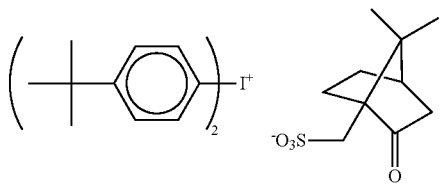
(B19) 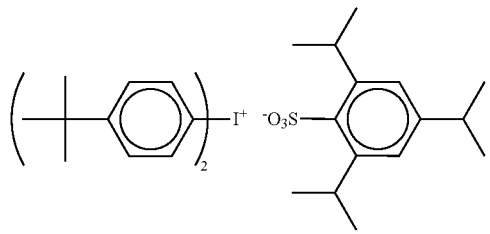
(B20) 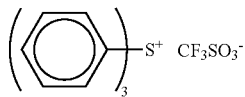
(B21) 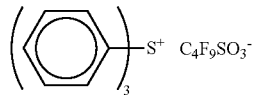
(B22) 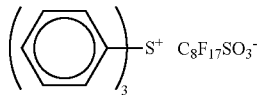
(B23) 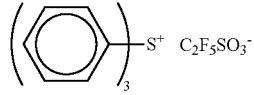
(B24) 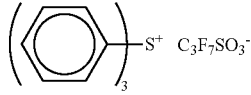
(B25) 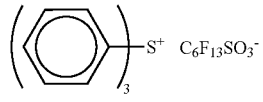
(B26) 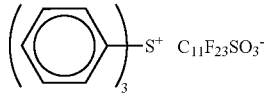
(B27) 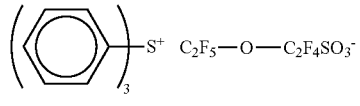
(B28) 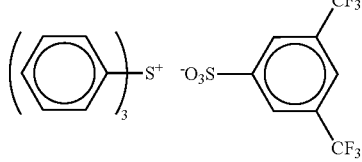
(B29) 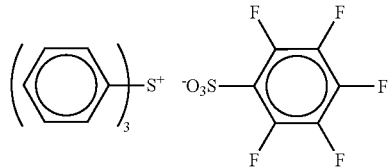
(B30) 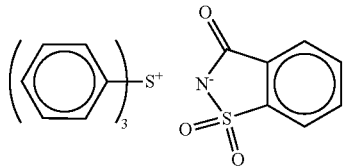
(B31) 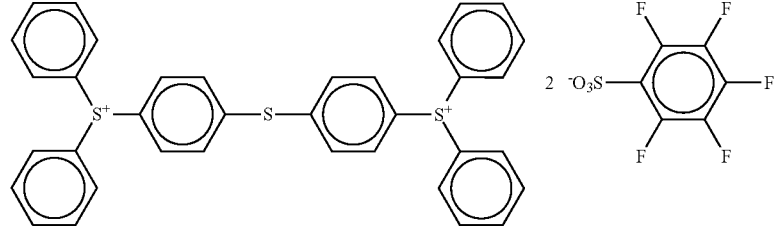

-continued
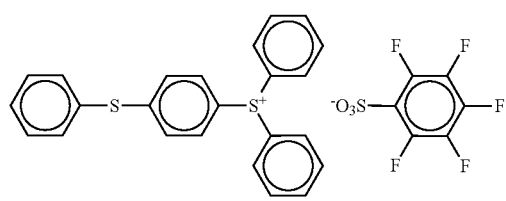 (B32)
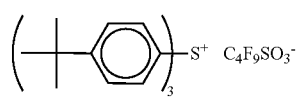 (B33)
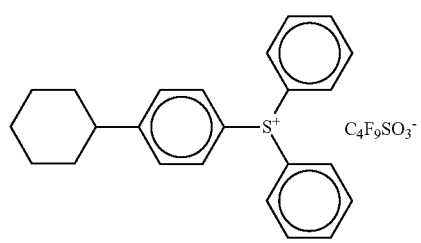 (B34)
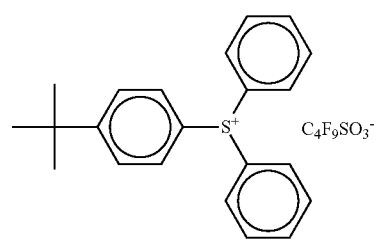 (B35)
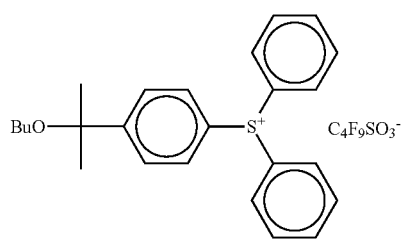 (B36)
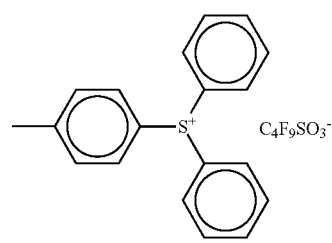 (B37)
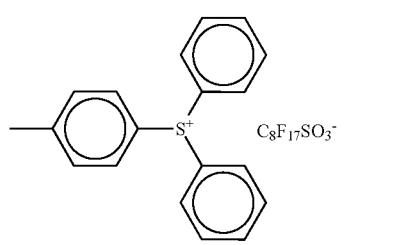 (B38)
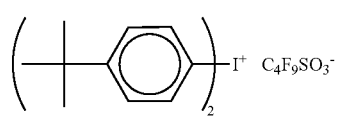 (B39)
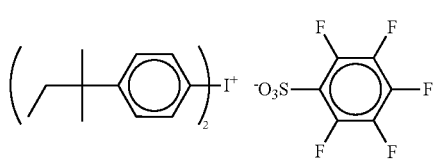 (B40)
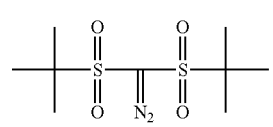 (B41)
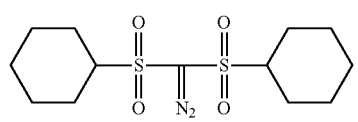 (B42)
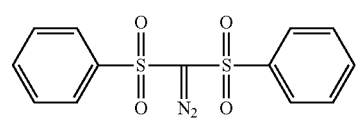 (B43)
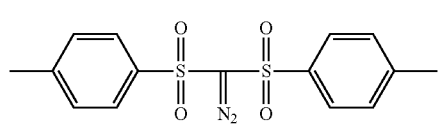 (B44)
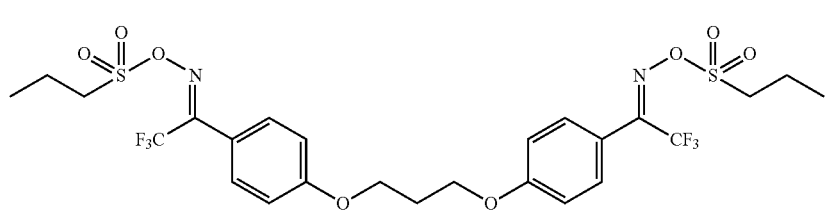 (B45)

-continued
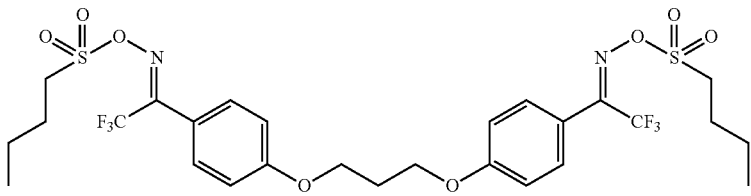
(B46)
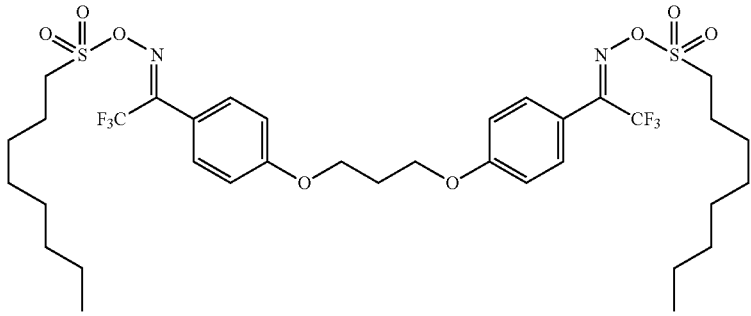
(B47)
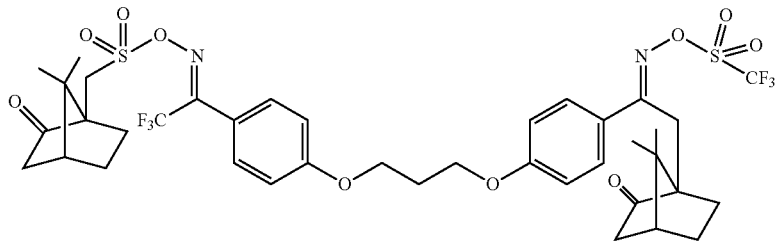
(B48)
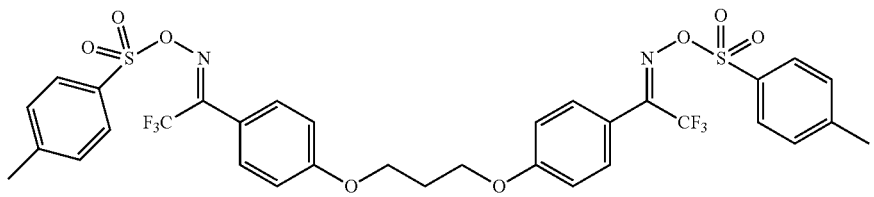
(B49)
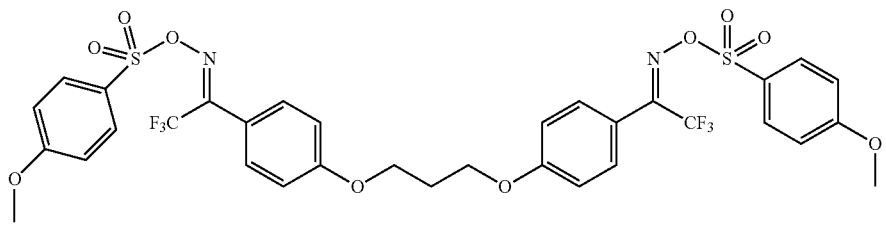
(B50)
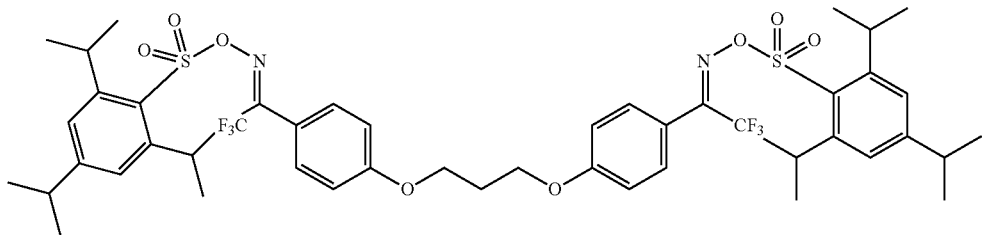
(B51)

-continued
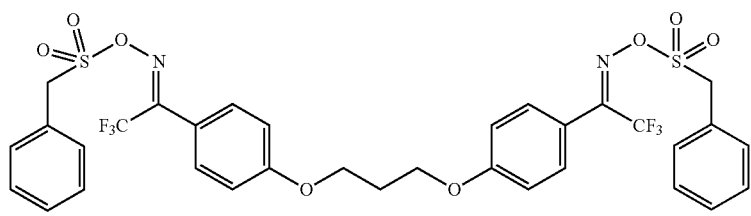
(B52)
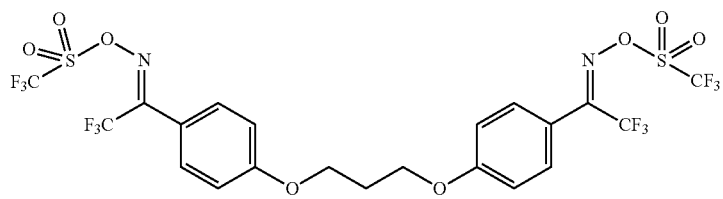
(B53)
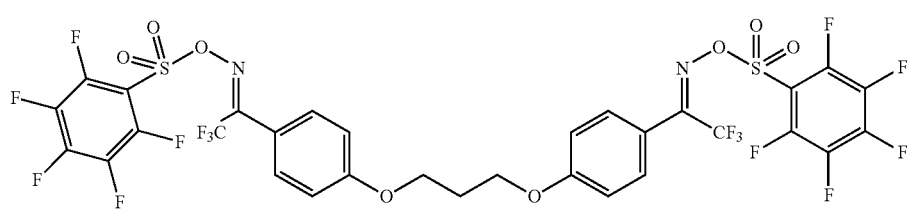
(B54)
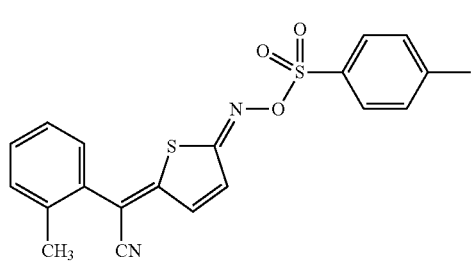
(B55)
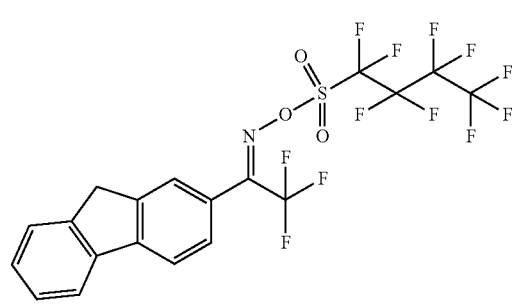
(B56)
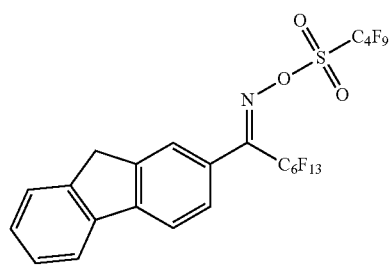
(B57)
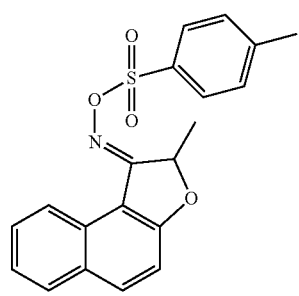
(B58)
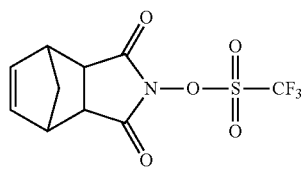
(B59)
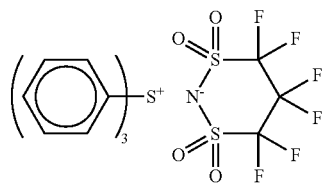
(B60)

-continued

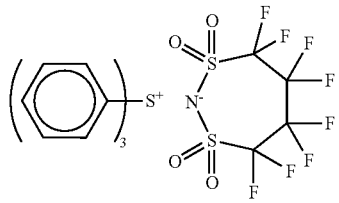 (B61)

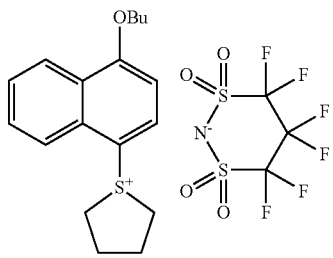 (B62)

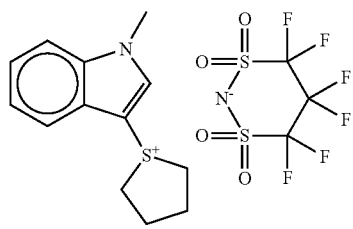 (B63)

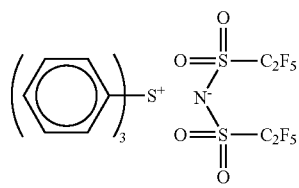 (B64)

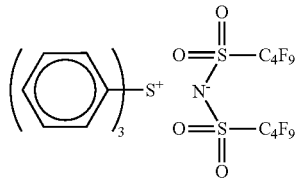 (B65)

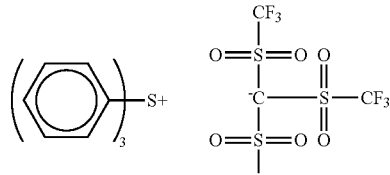 (B66)

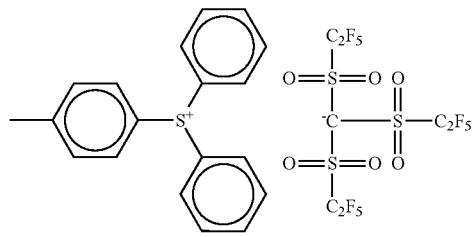 (B67)

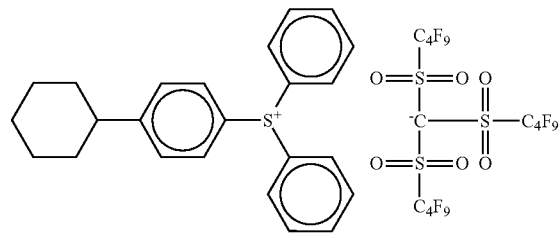 (B68)

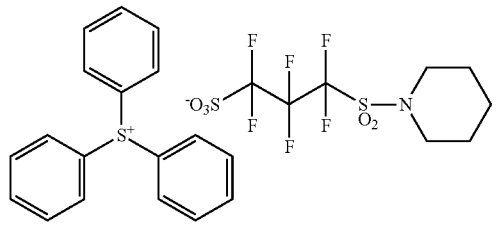 (B69)

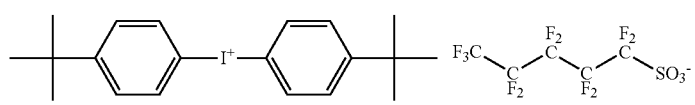 (B70)

As for the acid generator (B), one compound may be used alone, or two or more compounds may be used in combination. In the case of using two or more compounds in combination, compounds capable of generating two kinds of organic acids differing in the number of all atoms excluding hydrogen atom by 2 or more are preferably combined.

For example, the combination includes an embodiment where from the standpoint of enhancing the acid generation efficiency and the acid strength, a compound having a structure capable of generating a fluorine atom-containing acid and a compound not having such a structure are used in combination.

The content of the acid generator (B) in the composition is preferably from 0.1 to 20 mass %, more preferably from 0.5 to 15 mass %, still more preferably from 1 to 10 mass %, based on the entire solid content of the actinic ray-sensitive or radiation-sensitive resin composition.

[3] (C) Solvent

Examples of the solvent which can be used at the preparation of the actinic ray-sensitive or radiation-sensitive resin composition of the present invention include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate and alkyl pyruvate.

Specific examples of these solvents include those described in paragraphs [0441] to [0455] of U.S. Patent Application Publication 2008/0187860.

In the present invention, a mixed solvent prepared by mixing a solvent containing a hydroxyl group in the structure and a solvent not containing a hydroxyl group may be used as the organic solvent.

The solvent containing a hydroxyl group and the solvent not containing a hydroxyl group may be appropriately selected from the compounds exemplified above, but the solvent containing a hydroxyl group is preferably an alkylene glycol monoalkyl ether, an alkyl lactate or the like, more preferably propylene glycol monomethyl ether (PGME, another name: 1-methoxy-2-propanol) or ethyl lactate. The solvent not containing a hydroxyl group is preferably an alkylene glycol monoalkyl ether acetate, an alkyl alkoxypropionate, a monoketone compound which may contain a ring, a cyclic lactone, an alkyl acetate or the like, more preferably propylene glycol monomethyl ether acetate (PGMEA, another name: 1-methoxy-2-acetoxypropane), ethyl ethoxypropionate, 2-heptanone, γ-butyrolactone, cyclohexanone or butyl acetate, and most preferably propylene glycol monomethyl ether acetate, ethyl ethoxypropionate or 2-heptanone.

The mixing ratio (by mass) of the solvent containing a hydroxyl group to the solvent not containing a hydroxyl group is from 1/99 to 99/1, preferably from 10/90 to 90/10, more preferably from 20/80 to 60/40. A mixed solvent in which the solvent not containing a hydroxyl group accounts for 50 mass % or more is particularly preferred in view of coating uniformity.

The solvent preferably contains propylene glycol monomethyl ether acetate and is preferably a solvent containing propylene glycol monomethyl ether acetate alone or a mixed solvent of two or more kinds of solvents containing propylene glycol monomethyl ether acetate.

[4] (D) Basic Compound

The actinic ray-sensitive or radiation-sensitive resin composition of the present invention may contain (D) a basic compound so as to reduce the change of performance with aging from exposure to heating.

The basic compound is preferably a compound having a structure represented by the following formulae (A) to (E):

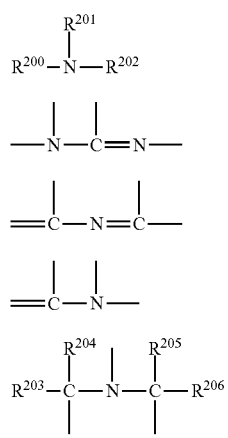

In formulae (A) and (E), each of $R^{200}$, $R^{201}$ and $R^{202}$, which may be the same or different, represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine together to form a ring. Each of $R^{203}$, $R^{204}$, $R^{205}$ and $R^{206}$, which may be the same or different, represents an alkyl group having a carbon number of 1 to 20.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

The alkyl group in formulae (A) and (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include a triarylsulfonium hydroxide, a phenacylsulfonium hydroxide, and a 2-oxoalkyl group-containing sulfonium hydroxide, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure is replaced by a carboxylate, and examples thereof include an acetate, an adamantane-1-carboxylate and a perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound, and a sulfonic acid ester group-containing ammonium salt compound.

In the phenoxy group-containing amine compound, phenoxy group-containing ammonium salt compound, sulfonic acid ester group-containing amine compound and sulfonic acid ester group-containing ammonium salt compound, at least one alkyl group is preferably bonded to the nitrogen atom. Also, an oxygen atom is preferably contained in the alkyl chain to form an oxyalkylene group. The number of oxyalkylene groups within the molecule is 1 or more, preferably from 3 to 9, more preferably from 4 to 6. Among oxyalkylene groups, structures of —CH$_2$CH$_2$O—, —CH(CH$_3$)CH$_2$O— and —CH$_2$CH$_2$CH$_2$O— are preferred.

Specific examples of the phenoxy group-containing amine compound, phenoxy group-containing ammonium salt compound, sulfonic acid ester group-containing amine compound and sulfonic acid ester group-containing ammonium salt compound include, but are not limited to, Compounds (C1-1) to (C3-3) illustrated in paragraph [0066] of U.S. Patent Application Publication 2007/0224539.

The actinic ray-sensitive or radiation-sensitive resin composition for use in the present invention may or may not contain a basic compound, but in the case of containing a basic compound, the amount used thereof is usually from 0.001 to 10 mass %, preferably from 0.01 to 5 mass %, based on the solid content of the actinic ray-sensitive or radiation-sensitive resin composition.

The ratio between the acid generator and the basic compound used in the composition is preferably acid generator/basic compound (molar ratio)=from 2.5 to 300. That is, the molar ratio is preferably 2.5 or more in view of sensitivity and resolution and is preferably 300 or less from the standpoint of suppressing the reduction in resolution due to thickening of the resist pattern with aging after exposure until heat treatment. The acid generator/basic compound (molar ratio) is more preferably from 5.0 to 200, still more preferably from 7.0 to 150.

[5] (E) Surfactant

The actinic ray-sensitive or radiation-sensitive resin composition for use in the present invention may or may not further contain a surfactant, but in the case of containing a surfactant, it is preferred to contain any one of fluorine-containing and/or silicon-containing surfactants (a fluorine-containing surfactant, a silicon-containing surfactant and a surfactant containing both a fluorine atom and a silicon atom), or two or more thereof.

By containing the surfactant, the actinic ray-sensitive or radiation-sensitive resin composition for use in the present invention can give a resist pattern improved in the sensitivity, resolution and adherence and reduced in the development defect when an exposure light source with a wavelength of 250 nm or less, particularly 220 nm or less, is used.

Examples of the fluorine-containing and/or silicon-containing surfactants include surfactants described in paragraph [0276] of U.S. Patent Application Publication No. 2008/0248425, such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106, and KH-20 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, polysiloxane polymer KP-341 (produced by Shin-Etsu Chemical Co., Ltd.) may be also used as the silicon-containing surfactant.

Other than those known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

Examples of the surfactant coming under the surfactant above include Megaface F178, F-470, F-473, F-475, F-476 and F-472 (produced by Dainippon Ink & Chemicals, Inc.); a copolymer of a C$_6$F$_{13}$ group-containing acrylate (or methacrylate) with a (poly(oxyalkylene)) acrylate (or methacrylate); and a copolymer of a C$_3$F$_7$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactant, described in paragraph [0280] of U.S. Patent Application Publication No. 2008/0248425, may be also used.

One of these surfactants may be used alone, or some of them may be used in combination.

The actinic ray-sensitive or radiation-sensitive resin composition of the present invention may or may not contain a surfactant, but in the case where the actinic ray-sensitive or radiation-sensitive resin composition contains a surfactant, the amount of the surfactant used is preferably from 0.0001 to 2 mass %, more preferably from 0.0005 to 1 mass %, based on the entire amount of the actinic ray-sensitive or radiation-sensitive resin composition (excluding the solvent).

[6] (F) Other Additives

The actinic ray-sensitive or radiation-sensitive resin composition for use in the present invention may or may not contain an onium carboxylate. Examples of the onium carboxylate include those described in paragraphs [0605] to [0606] of U.S. Patent Application Publication No. 2008/0187860.

Such an onium carboxylate can be synthesized by reacting a sulfonium hydroxide, iodonium hydroxide or ammonium hydroxide and a carboxylic acid with silver oxide in an appropriate solvent.

In the case where the actinic ray-sensitive or radiation-sensitive resin composition contains an onium carboxylate, the content thereof is generally from 0.1 to 20 mass %, preferably from 0.5 to 10 mass %, more preferably from 1 to 7 mass %, based on the entire solid content of the composition.

The actinic ray-sensitive or radiation-sensitive resin composition of the present invention may further contain, for example, a dye, a plasticizer, a photo sensitizer, a light absorber, an alkali-soluble resin, a dissolution inhibitor, and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art while referring to the method described, for example, in JP-A-4-122938, JP-A-2-28531, U.S. Pat. No. 4,916,210 or European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid, and a cyclohexanedicarboxylic acid.

From the standpoint of enhancing the resolution, the actinic ray-sensitive or radiation-sensitive resin composition for use in the present invention is preferably used in a film thickness of 30 to 250 nm, more preferably from 30 to 200 nm. Such a film thickness can be achieved by setting the solid content concentration in the composition to an appropriate range, thereby imparting an appropriate viscosity and enhancing the coatability and film-forming property.

On the other hand, in the present invention, when applying the actinic ray-sensitive or radiation-sensitive resin composition to ion implantation using the later-described stepped substrate or the like, from the standpoint of obtaining sufficient ion blocking effect, the thickness of the film formed of the composition is preferably 150 nm or more, more preferably 200 nm or more, still more preferably 250 nm or more. Also, in view of rectangularity and resolution, the film thickness is preferably 500 nm or less, more preferably 400 nm or less.

The stepped substrate as used herein indicates a substrate where at least one stepped shape is formed on a substrate.

In the case of coating the actinic ray-sensitive or radiation-sensitive resin composition on the stepped substrate, the thickness of the film formed of the actinic ray-sensitive or radiation-sensitive resin composition means the height from the bottom on the stepped substrate to the top of the film formed. Accordingly, in the case of coating on the stepped substrate, the thickness of the film is preferably 200 nm or more.

The height from the bottom of the stepped substrate to the top of the stepped shape is preferably smaller than the thickness of the resist film and, for example, is preferably less than 200 nm.

The height from the bottom of the stepped substrate to the top of the stepped shape is preferably 10 nm or more (that is, a stepped substrate having a step of 10 nm or more in height is preferred).

The stepped substrate includes, for example, a stepped substrate where steps with a space of 20 to 200 nm, a pitch of 40 to 700 nm and a height of 10 to 200 nm are repeated at regular intervals.

The entire solid content concentration in the actinic ray-sensitive or radiation-sensitive resin composition for use in the present invention is usually from 1.0 to 15 mass %, preferably from 2.5 to 13 mass %, more preferably from 3.0 to 12 mass %. By setting the solid content concentration to the range above, the resist solution can be uniformly coated on a substrate and furthermore, a resist pattern having high resolution and a rectangular profile and being excellent in the etching resistance can be formed. The reason therefor is not clearly known, but it is considered that thanks to a solid content concentration of 10 mass % or less, preferably 5.7 mass % or less, aggregation of materials, particularly, a photoacid generator, in the resist solution is suppressed, as a result, a uniform resist film can be formed.

The solid content concentration is a weight percentage of the weight of resist components excluding the solvent, based on the total weight of the actinic ray-sensitive or radiation-sensitive resin composition.

The actinic ray-sensitive or radiation-sensitive resin composition for use in the present invention is used by dissolving the components above in a predetermined organic solvent, preferably in the above-described mixed solvent, filtering the solution, and coating it on a predetermined support (substrate). The filter used for filtration is preferably a polytetrafluoro ethylene-, polyethylene- or nylon-made filter having a pore size of 0.1 µm or less, more preferably 0.05 µm or less, still more preferably 0.03 µm or less. In the filtration through a filter, as described, for example, in JP-A-2002-62667, circulating filtration may be performed, or the filtration may be performed by connecting a plurality of kinds of filters in series or in parallel. Also, the composition may be filtered a plurality of times. Furthermore, a deaeration treatment or the like may be applied to the composition before and after filtration through a filter.

[7] Pattern Forming Method

The pattern forming method (negative pattern forming method) of the present invention comprises at least:

(i) a step of forming a film (resist film) from an actinic ray-sensitive or radiation-sensitive resin composition, (ii) a step of exposing the film, and (iii) a step of performing development by using a developer.

The exposure in the step (ii) may be immersion exposure.

The pattern forming method of the present invention preferably has (iv) a heating step after the exposure step (ii).

The pattern forming method of the present invention may further have (v) a step of performing development by using an alkali developer.

In the pattern forming method of the present invention, the exposure step (ii) may be performed a plurality of times.

In the pattern forming method of the present invention, the heating step (v) may be performed a plurality of times.

The resist film is formed from the above-described actinic ray-sensitive or radiation-sensitive resin composition according to the present invention and, more specifically, is preferably formed on a substrate. In the pattern forming method of the present invention, the step of forming a film on a substrate by using an actinic ray-sensitive or radiation-sensitive resin composition, the step of exposing the film, and the development step can be performed by generally known methods.

It is also preferred to contain, after film formation, a pre-baking step (PB) before entering the exposure step.

Furthermore, it is also preferred to contain a post-exposure baking step (PEB) after the exposure step but before the development step.

As for the heating temperature, both PB and PEB are preferably performed at 70 to 130° C., more preferably at 80 to 120° C.

The heating time is preferably from 30 to 300 seconds, more preferably from 30 to 180 seconds, still more preferably from 30 to 90 seconds.

The heating can be performed using a device attached to an ordinary exposure/developing machine or may be performed using a hot plate or the like.

Thanks to baking, the reaction in the exposed area is accelerated, and the sensitivity and pattern profile are improved.

The light source wavelength of the exposure apparatus for use in the present invention includes, for example, KrF excimer laser (248 nm), EUV (13 nm) and electron beam and is preferably KrF excimer laser.

In the present invention, the substrate on which the film is formed is not particularly limited, and an inorganic substrate such as silicon, SiN, $SiO_2$ and SiN, a coating-type inorganic substrate such as SOG, or a substrate generally used in the process of producing a semiconductor such as IC or producing a liquid crystal device or a circuit board such as thermal head or in the lithography of other photofabrication processes can be used.

For example, in the microfabrication such as application to ion implantation, the pattern forming method of the present invention can be performed by using a stepped substrate as the substrate.

For example, in the case of microfabrication such as application to ion implantation, a substrate obtained by patterning fins or gates on a flat substrate can be used as the stepped substrate. The thickness of the resist film formed by coating the actinic ray-sensitive or radiation-sensitive resin composition on a stepped substrate having formed thereon fins or gates does not mean the height from the top of the fin or gate to the top of the resist film formed but, as described above, means the height from the bottom on the stepped substrate to the top of the resist film formed.

As for the size (e.g., width, length, height), interval, structure, configuration and the like of fins and gates, those described, for example, in "Saisentan FinFET Process/Shuseki-ka Gijutsu (Advanced FinFET Process/Integration Technology" of *Journal of IEICE*, Vol. 91, No. 1, pp. 25-29 (2008), and "Fin-Type Double-Gate Metal-Oxide-Semiconductor Field-Effect Transistors Fabricated by Orientation-Dependent Etching and Electron Beam Lithography" of *Jpn. J. Appl. Phys., Vol.* 42 (2003), pp. 4142-4146, Part 1, No. 6B, June 203, can be appropriately applied.

In the pattern forming method of the present invention, from the standpoint of achieving the effects of the present invention, an anti-reflective film is not required, but an organic anti-reflective film may be formed between the film and the substrate, if desired.

For example, an antireflection film may be provided as the underlayer of the resist. The antireflection film which can be used may be either an inorganic film type such as titanium, titanium dioxide, titanium nitride, chromium oxide, carbon and amorphous silicon, or an organic film type composed of a light absorber and a polymer material. The former requires equipment for the film formation, such as vacuum deposition apparatus, CVD apparatus and sputtering apparatus. Examples of the organic antireflection film include a film composed of a diphenylamine derivative/formaldehyde-modified melamine resin condensation product, an alkali-soluble resin and a light absorber described in JP-B-7-69611 (the term "JP-B" as used herein means an "examined Japanese patent publication"); a reaction product of a maleic anhydride copolymer and a diamine-type light absorber described in U.S. Pat. No. 5,294,680; a film containing a resin binder and a methylolmelamine-based thermal cross-linking agent described in JP-A-6-118631; an acrylic resin-type antireflection film containing a carboxylic acid group, an epoxy group and a light absorbing group within the same molecule described in 2-A-6-118656; a film composed of a methylolmelamine and a benzophenone-based light absorber described in JP-A-8-87115; and a film obtained by adding a low molecular light absorber to a polyvinyl alcohol resin described in JP-A-8-179509.

Also, a commercially available organic antireflection film such as DUV30 Series and DUV-40 Series produced by Brewer Science, Inc., or AR-2, AR-3 and AR-5 produced by Shipley Co., Ltd. can be used as the organic antireflection film.

If desired, an antireflection film may be used as the overlayer of the resist.

Examples of the antireflection film include AQUATAR-II, AQUATAR-III and AQUATAR-VII produced by AZ Electronic Materials.

In the pattern forming method of the present invention, as the developer in the step of performing development by using an organic solvent-containing developer (hereinafter, sometimes referred to as an "organic developer"), a polar solvent such as ketone-based solvent, ester-based solvent, alcohol-based solvent, amide-based solvent and ether-based solvent, or a hydrocarbon-based solvent can be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl format; propyl formate, ethyl lactate, butyl lactate and propyl lactate.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol mono ethyl ether, and methoxymethyl butanol.

Examples of the ether-based solvent include, in addition to the glycol ether-based solvents above, dioxane and tetrahydrofuran.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

A plurality of these solvents may be mixed, or the solvent may be used by mixing it with a solvent other than those described above or with water. However, in order to sufficiently bring out the effects of the present invention, the water content ratio in the entire developer is preferably less than 10 mass %, and it is more preferred to contain substantially no water.

That is, the amount of the organic solvent used in the organic developer is preferably from 90 to 100 mass %, more preferably from 95 to 100 mass %, based on the entire amount of the developer.

In particular, the organic developer is preferably a developer containing at least one kind of an organic solvent selected from a ketone-based solvent, an ester-based solvent, an alcohol-based solvent, an amide-based solvent and an ether-based solvent.

The vapor pressure at 20° C. of the organic developer is preferably 5 kPa or less, more preferably 3 kPa or less, still more preferably 2 kPa or less. By setting the vapor pressure of the organic developer to 5 kPa or less, evaporation of the developer on a substrate or in a development cup is suppressed and the temperature uniformity in the wafer plane is enhanced, as a result, the dimensional uniformity in the wafer plane is improved.

Specific examples of the solvent having a vapor pressure of 5 kPa or less include a ketone-based solvent such as 1-octanone, 2-octanone, 1-nonanone, 2-nonanone, 2-heptanone (methyl amyl ketone), 4-heptanone, 2-hexanone, diisobutyl ketone, cyclohexanone, methyleyclohexanone, phenylacetone and methyl isobutyl ketone; an ester-based solvent such as butyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monomethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent such as tetrahydrofuran; an amide-based solvent such as N-methyl-2-pyrrolidone, N,N-dimethylacetamide and N,N-dimethylformamide; an aromatic hydrocarbon-based solvent such as toluene and xylene; and an aliphatic hydrocarbon-based solvent such as octane and decane.

Specific examples of the solvent having a vapor pressure of 2 kPa or less that is a particularly preferred range include a ketone-based solvent such as 1-octanone, 2-octanone, 1-nonanone, 2-nonanone, 4-heptanone, 2-hexanone, diisobutyl ketone, cyclohexanone, methyleyclohexanone and phenylacetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate and propyl lactate; an alcohol-based solvent such as n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an amide-based solvent such as N-methyl-2-pyrrolidone, N,N-dimethylacetamide and N,N-dimethylformamide; an aromatic hydrocarbon-based solvent such as xylene; and an aliphatic hydrocarbon-based solvent such as octane and decane.

In the organic developer, a surfactant may be added in an appropriate amount, if desired.

The surfactant is not particularly limited but, for example, ionic or nonionic fluorine-containing and/or silicon-containing surfactants can be used. Examples of such fluorine-containing and/or silicon-containing surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. A nonionic surfactant is preferred. The nonionic surfactant is not particularly limited, but use of a fluorine-containing surfactant or a silicon-containing surfactant is more preferred.

The amount of the surfactant used is usually from 0.001 to 5 mass %, preferably from 0.005 to 2 mass %, more preferably from 0.01 to 0.5 mass %, based on the entire amount of the developer.

As to the developing method, for example, a method of dipping the substrate in a bath filled with the developer for a fixed time (dipping method), a method of raising the developer on the substrate surface by the effect of a surface tension and keeping it still for a fixed time, thereby performing development (puddle method), a method of spraying the developer on the substrate surface (spraying method), and a method of continuously ejecting the developer on the substrate spinning at a constant speed while scanning the developer ejecting nozzle at a constant rate (dynamic dispense method) may be applied.

In the case where the above-described various developing methods include a step of ejecting the developer toward the resist film from a development nozzle of a developing apparatus, the ejection pressure of the developer ejected (the flow velocity per unit area of the developer ejected) is preferably 2 mL/sec/mm$^2$ or less, more preferably 1.5 mL/sec/mm$^2$ or less, still more preferably 1 mL/sec/mm$^2$ or less. The flow velocity has no particular lower limit but in view of throughput, is preferably 0.2 mL/sec/mm$^2$ or more.

By setting the ejection pressure of the ejected developer to the range above, pattern defects attributable to the resist scum after development can be greatly reduced.

Details of this mechanism are not clearly known, but it is considered that thanks to the ejection pressure in the above-described range, the pressure imposed on the resist film by the developer becomes small and the resist film/resist pattern is kept from inadvertent chipping or collapse.

Here, the ejection pressure (mL/sec/mm$^2$) of the developer is the value at the outlet of the development nozzle in the developing apparatus.

Examples of the method for adjusting the ejection pressure of the developer include a method of adjusting the ejection pressure by a pump or the like, and a method of supplying the developer from a pressurized tank and adjusting the pressure to change the ejection pressure.

After the step of performing development by using an organic solvent-containing developer, a step of stopping the development by replacing the solvent with another solvent may be practiced.

A step of rinsing the film by using a rinsing solution is preferably provided after the step of performing development by using an organic solvent-containing developer.

The rinsing solution used in the rinsing step after the step of performing development by using an organic solvent-containing developer is not particularly limited as long as it does not dissolve the resist pattern, and a solution containing a general organic solvent may be used. A rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent is preferably used as the rinsing solution.

Specific examples of the hydrocarbon-based solvent, ketone-based solvent, ester-based solvent, alcohol-based solvent, amide-based solvent and ether-based solvent are the same as those described above for the organic solvent-containing developer.

More preferably, after the step of performing development by using an organic solvent-containing developer, a step of rinsing the film by using a rinsing solution containing at least one kind of an organic solvent selected from the group consisting of a ketone-based solvent, an ester-based solvent, an alcohol-based solvent and an amide-based solvent is preformed; still more preferably, a step of rinsing the film by using a rinsing solution containing an alcohol-based solvent or an ester-based solvent is performed; yet still more preferably, a step of rinsing the film by using a rinsing solution containing a monohydric alcohol is performed; and most preferably, a step of rinsing the film by using a rinsing solution containing a monohydric alcohol having a carbon number of 5 or more is performed.

The monohydric alcohol used in the rinsing step includes a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. As the particularly preferred monohydric alcohol having a carbon number of 5 or more, 1-hexanol, 2-hexanol, 4-methyl-2-pentanol, 1-pentanol, 3-methyl-1-butanol and the like can be used.

A plurality of these components may be mixed, or the solvent may be used by mixing it with an organic solvent other than those described above.

The water content ratio in the rinsing solution is preferably 10 mass % or less, more preferably 5 mass % or less, still more preferably 3 mass % or less. By setting the water content ratio to 10 mass % or less, good development characteristics can be obtained.

The vapor pressure at 20° C. of the rinsing solution used after the step of performing development by using an organic solvent-containing developer is preferably from 0.05 to 5 kPa, more preferably from 0.1 to 5 kPa, and most preferably from 0.12 to 3 kPa. By setting the vapor pressure of the rinsing solution to the range from 0.05 to 5 kPa, the temperature uniformity in the wafer plane is enhanced and furthermore, swelling due to permeation of the rinsing solution is suppressed, as a result, the dimensional uniformity in the wafer plane is improved.

The rinsing solution may be also used after adding thereto an appropriate amount of a surfactant.

In the rinsing step, the wafer after development using an organic solvent-containing developer is rinsed by using the above-described organic solvent-containing rinsing solution. The method for rinsing treatment is not particularly limited but, for example, a method of continuously ejecting the rinsing solution on the substrate spinning at a constant speed (spin coating method), a method of dipping the substrate in a bath filled with the rinsing solution for a fixed time (dipping method), and a method of spraying the rinsing solution on the substrate surface (spraying method) can be applied. Above all, it is preferred to perform the rinsing treatment by the spin coating method and after the rinsing, remove the rinsing solution from the substrate surface by spinning the substrate at a rotational speed of 2,000 to 4,000 rpm. It is also preferred to include a heating step (Post Bake) after the rinsing step. Thanks to the baking, the developer and rinsing solution remaining between patterns and in the inside of the pattern are removed. The heating step after the rinsing step is performed at usually from 40 to 160° C., preferably from 70 to 95° C., for usually from 10 seconds to 3 minutes, preferably from 30 to 90 seconds.

In the case where the pattern forming method of the present invention further includes a step of developing the film by using an alkali developer, examples of the alkali developer which can be used include an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

The alkaline aqueous solution above may be also used after adding thereto alcohols and a surfactant each in an appropriate amount.

The alkali concentration of the alkali developer is usually from 0.1 to 20 mass %.

The pH of the alkali developer is usually from 10.0 to 15.0.

In particular, an aqueous 2.38 mass % tetramethylammonium hydroxide solution is preferred.

As the rinsing solution in the rinsing treatment performed after the alkali development, pure water is used, and the pure water may be also used after adding thereto an appropriate amount of a surfactant.

After the development treatment or rinsing treatment, a treatment of removing the developer or rinsing solution adhering on the pattern by a supercritical fluid may be performed.

The present invention also relates to a method for manufacturing an electronic device, comprising the pattern forming method of the present invention, and an electronic device manufactured by this manufacturing method.

The electronic device of the present invention is suitably mounted on electric electronic equipment (such as home electronic device, OA•media-related device, optical device and communication device).

EXAMPLES

The present invention is described in greater detail below by referring to Examples, but the present invention should not be construed as being limited to these Examples.

The repeating units in the resins used in Examples are illustrated below.

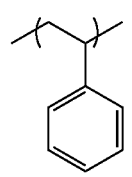

Unit 1-1

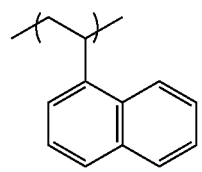

Unit 1-2

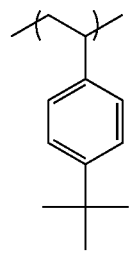

Unit 1-3

Unit 1-4
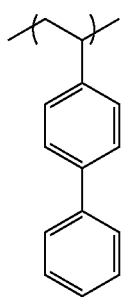
Unit 1-5
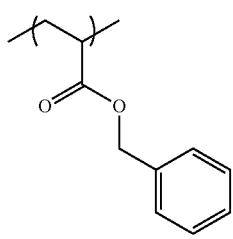
Unit 1-6
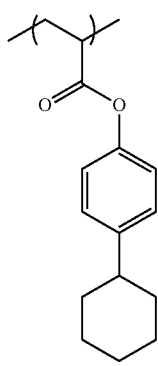
Unit 1-7
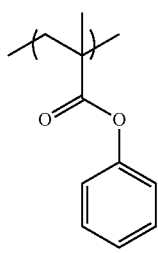
Unit 1-8
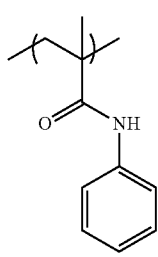
Unit 1-9
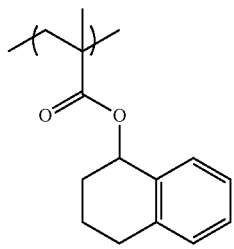
Unit 1-10
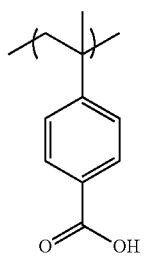
Unit 1-11
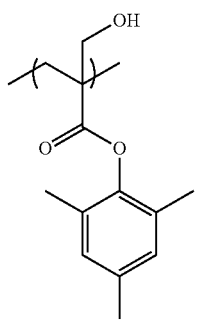
Unit 1-12
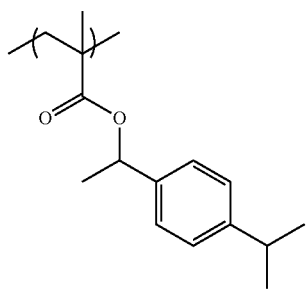
Unit 1-13
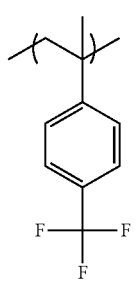
Unit 1-14
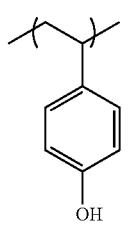

-continued
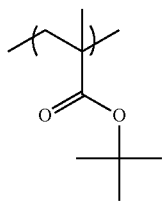
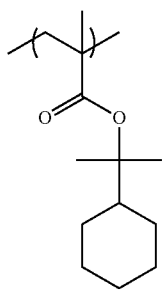
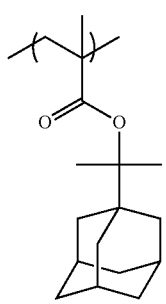
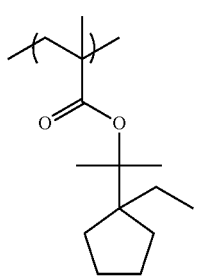
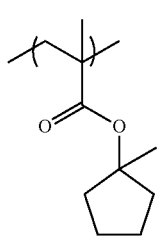
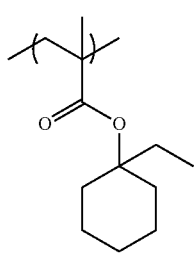
-continued
Unit 2-1
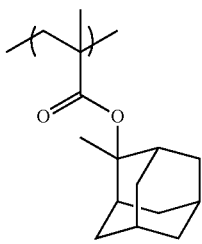
Unit 2-2
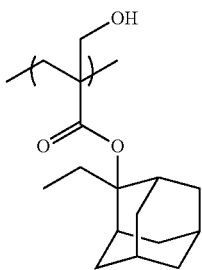
Unit 2-3
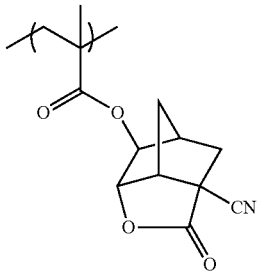
Unit 2-4
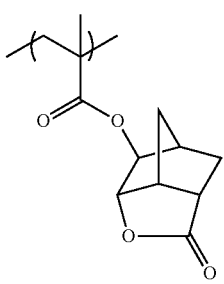
Unit 2-5
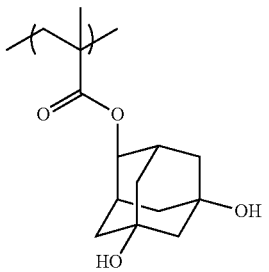
Unit 2-6
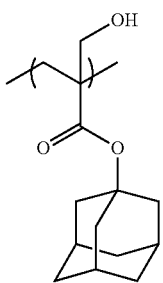
Unit 2-7
Unit 2-8
Unit 3-1
Unit 3-2
Unit 3-3
Unit 3-4

-continued

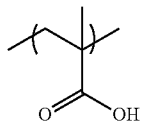

Unit 3-5

Synthesis Example 1

Synthesis of Resin (Pol-01)

In a nitrogen stream, 90.2 g of cyclohexanone was charged into a three-neck flask and heated at 75° C. Subsequently, a monomer (54.2 g) corresponding to the above Unit 1-1, a monomer (92.4 g) corresponding to the above Unit 2-1, and a monomer (28.9 g) corresponding to the above Unit 3-2 were dissolved in cyclohexanone (361 g) to prepare a monomer solution. Furthermore, a solution obtained by adding and dissolving 5.99 g (2 mol % based on the total amount of monomers) of polymerization initiator V-601 (produced by Wako Pure Chemical Industries, Ltd.) was added dropwise to the flask over 4 hours. After the completion of dropwise addition, the solution was further reacted at 75° C. for 2 hours. The reaction solution was allowed to cool and then added dropwise to a mixed solvent of 7,408 g of heptane/823 g of ethyl acetate, and the precipitated powder was collected by filtration and dried to obtain 109 g of Resin (Pol-01). The weight average molecular weight of Resin (Pol-01) obtained was 30,000, the polydispersity (Mw/Mn) was 1.7, and the compositional ratio as measured by $^{13}$C-NMR was 40/50/10.

Resins (Pol-02) to (Pol-15) were synthesized by the same operation as in Synthesis Example 1.

With respect to Resins (Pol-01) to (Pol-15), the repeating unit (unit), the compositional ratio (molar ratio), the weight average molecular weight and the polydispersity are shown in Table 1. The numerals in the compositional ratio correspond to repeating units starting from the left.

TABLE 1

| Resin | Unit 1 | Unit 2 | Unit 3 | Unit 4 | Compositional Ratio | Weight Average Molecular Weight | Polydispersity | Remarks |
|---|---|---|---|---|---|---|---|---|
| Pol-01 | Unit 1-1 | Unit 2-1 | Unit 3-2 | — | 40/50/10 | 30000 | 1.7 | Example |
| Pol-02 | Unit 1-3 | Unit 2-5 | Unit 3-5 | — | 30/60/10 | 18000 | 1.7 | Example |
| Pol-03 | Unit 1-5 | Unit 2-1 | Unit 3-5 | Unit 3-1 | 30/50/10/10 | 20000 | 1.8 | Example |
| Pol-04 | Unit 1-6 | Unit 2-4 | Unit 1-2 | — | 40/50/10 | 10000 | 1.6 | Example |
| Pol-05 | Unit 1-7 | Unit 2-5 | Unit 2-3 | Unit 3-3 | 50/30/10/10 | 16000 | 1.8 | Example |
| Pol-06 | Unit 1-9 | Unit 2-6 | Unit 3-4 | — | 40/40/20 | 21000 | 1.8 | Example |
| Pol-07 | Unit 1-11 | Unit 2-2 | Unit 2-7 | Unit 1-13 | 40/40/10/10 | 26000 | 1.8 | Example |
| Pol-08 | Unit 1-5 | Unit 2-1 | Unit 3-2 | Unit 3-5 | 30/50/10/10 | 25000 | 1.7 | Example |
| Pol-09 | Unit 1-1 | Unit 2-8 | Unit 1-8 | — | 30/60/10 | 10000 | 1.6 | Example |
| Pol-10 | Unit 1-12 | Unit 2-4 | Unit 1-4 | — | 30/60/10 | 13000 | 1.7 | Example |
| Pol-11 | Unit 1-11 | Unit 2-6 | Unit 1-10 | Unit 3-3 | 30/40/20/10 | 18000 | 1.8 | Example |
| Pol-12 | Unit 1-12 | Unit 2-5 | Unit 3-1 | — | 40/50/10 | 9500 | 1.7 | Example |
| Pol-13 | Unit 1-1 | Unit 2-4 | Unit 1-14 | — | 40/50/10 | 13000 | 1.7 | Example |
| Pol-14 | Unit 1-14 | Unit 2-1 | Unit 3-5 | — | 30/50/20 | 12000 | 1.7 | Comparative Example |
| Pol-15 | Unit 3-2 | Unit 2-2 | Unit 3-5 | — | 40/50/10 | 11000 | 1.7 | Comparative Example |

[Preparation of Actinic Ray-Sensitive or Radiation-Sensitive Resin Composition]

The components shown in Table 2 below were dissolved in a solvent to prepare a resist solution, and this solution was microfiltered through a polyethylene filter having a pore size of 0.03 μm to prepare an actinic ray-sensitive or radiation-sensitive resin composition (resist composition) having a solid content concentration of 6.0 mass %.

TABLE 2

| Resist Composition | Resin-A (mass %)* | Resin-B (mass %) | PAG-A (mass %) | PAG-B (mass %) | Basic Compound-A (mass %) | Basic compound-B (mass %) | Additive (mass %) | Solvent (mass ratio) | Remarks |
|---|---|---|---|---|---|---|---|---|---|
| Res-01 | Pol-01 (93.82) | — | PAG-4 (5.95) | — | Amine-2 (0.23) | — | — | A1/A3 (70/30) | Example |
| Res-02 | Pol-02 (92.18) | — | PAG-11 (7.21) | — | Amine-3 (0.18) | Amine-4 (0.13) | W-4 (0.30) | A1/B1 (80/20) | Example |
| Res-03 | Pol-03 (93.31) | — | PAG-1 (4.83) | PAG-4 (1.34) | Amine-5 (0.22) | — | W-3 (0.30) | A1/B2 (60/40) | Example |
| Res-04 | Pol-04 (93.39) | — | PAG-4 (4.01) | PAG-5 (2.30) | — | — | W-4 (0.30) | A1/A2 (70/30) | Example |
| Res-05 | Pol-05 (92.62) | — | PAG-7 (6.89) | — | Amine-6 (0.19) | — | W-2 (0.30) | A1/B2 (80/20) | Example |
| Res-06 | Pol-06 (74.72) | Pol-02 (18.68) | PAG-1 (3.51) | PAG-10 (2.64) | Amine-1 (0.15) | — | W-1 (0.30) | A1/A3 (60/40) | Example |
| Res-07 | Pol-07 (92.94) | — | PAG-8 (6.41) | — | Amine-4 (0.35) | — | W-4 (0.30) | A1 (100) | Example |
| Res-08 | Pol-08 (91.60) | — | PAG-6 (7.92) | — | Amine-1 (0.18) | — | W-4 (0.30) | A1/B1 (70/30) | Example |
| Res-09 | Pol-09 (65.97) | Pol-03 (28.27) | PAG-9 (5.31) | — | Amine-6 (0.15) | — | W-2 (0.30) | A1/A3 (80/20) | Example |

TABLE 2-continued

| Resist Composition | Resin-A (mass %)* | Resin-B (mass %) | PAG-A (mass %) | PAG-B (mass %) | Basic Compound-A (mass %) | Basic compound-B (mass %) | Additive (mass %) | Solvent (mass ratio) | Remarks |
|---|---|---|---|---|---|---|---|---|---|
| Res-10 | Pol-10 (89.27) | — | PAG-2 (9.33) | PAG-4 (0.80) | Amine-5 (0.30) | — | W-4 (0.30) | A1/B1 (60/40) | Example |
| Res-11 | Pol-11 (93.24) | — | PAG-3 (6.61) | — | Amine-3 (0.15) | — | — | A1/B2 (70/30) | Example |
| Res-12 | Pol-12 (93.94) | — | PAG-6 (5.58) | — | Amine-3 (0.10) | Amine-4 (0.08) | W-1 (0.30) | A3/B1 (70/30) | Example |
| Res-13 | Pol-13 (90.78) | — | PAG-2 (8.72) | — | Amine-6 (0.20) | — | W-4 (0.30) | A1/A3 (60/40) | Example |
| Res-14 | Pol-14 (92.67) | — | PAG-3 (6.89) | — | Amine-1 (0.14) | — | W-4 (0.30) | A1/B1 (80/20) | Comparative Example |
| Res-15 | Pol-15 (93.40) | — | PAG-6 (6.10) | — | Amine-3 (0.20) | — | W-1 (0.30) | A1/A3 (70/30) | Comparative Example |

*In the Table, (mass %) is the value based on the entire solid content of the composition.

Components and abbreviations in Table 2 are as follows.

[Acid Generator]

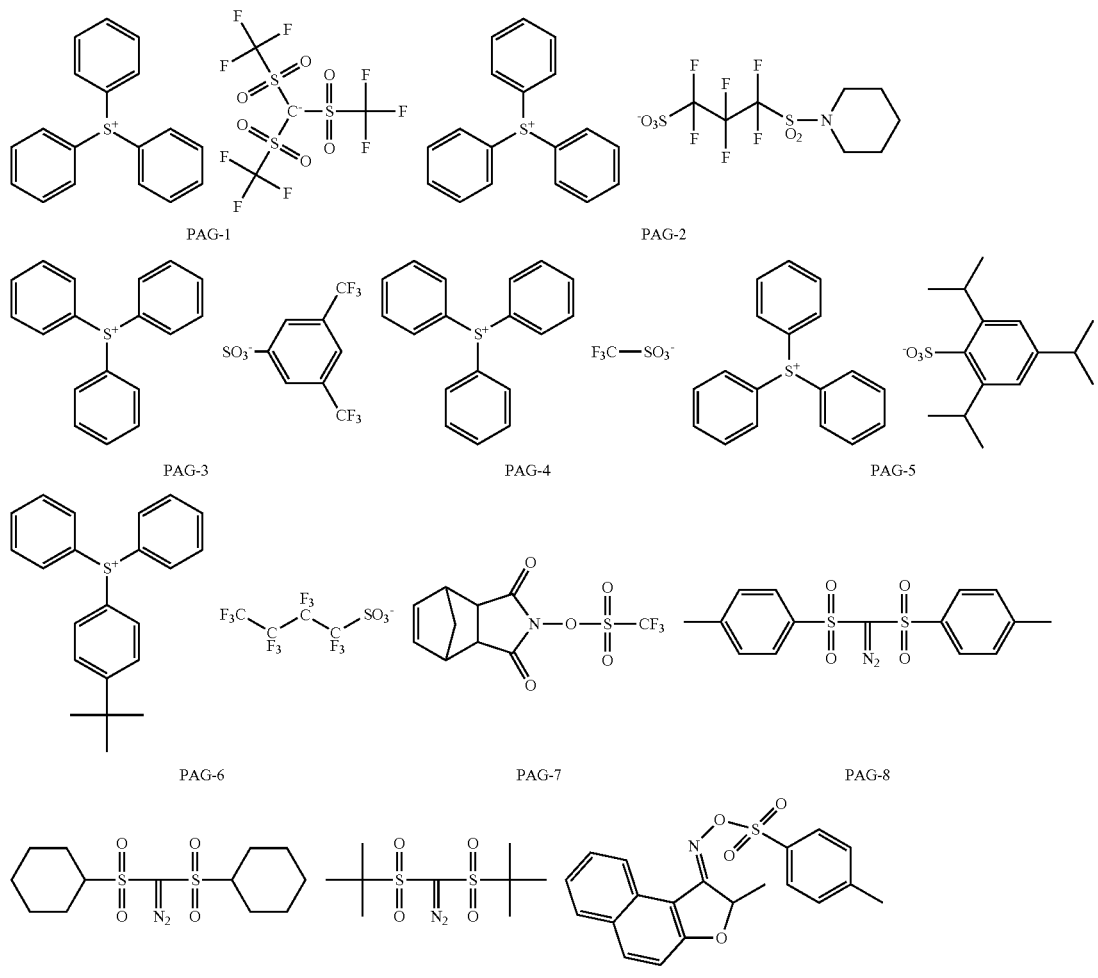

[Basic Compound]

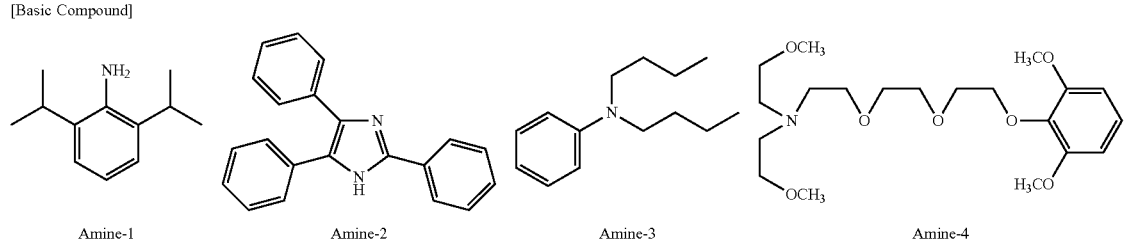

TABLE 2-continued

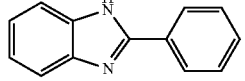

Amine-5        Amine-6

[Additive (Surfactant)]
W-1: Megaface F176 (produced by Dainippon Ink and Chemicals, Inc.) (fluorine-containing)
W-2: Megaface R08 (produced by Dainippon Ink and Chemicals, Inc.) (fluorine- and silicon-containing)
W-3: Polysiloxane Polymer KP-341 (produced by Shin-Etsu Chemical Co., Ltd.) (silicon-containing)
W-4: Structure shown below.

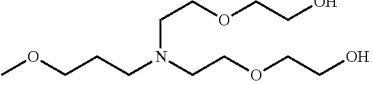

[Solvent]
A1: Propylene glycol monomethyl ether acetate (PGMEA)
A2: γ-Butyrolactone
A3: Cyclohexanone
B1: Propylene glycol monomethyl ether (PGME)
B2: Ethyl lactate
[Developer/Rinsing Solution]
S-1: Butyl acetate
S-2: Pentyl acetate
S-3: Anisole
S-4: 1-Hexanol
S-5: 4-Methyl-2-pentanol
S-6: Decane
S-7: Octane
S-8: 1-Hexanol The prepared actinic ray-sensitive or radiation-sensitive resin composition was evaluated by the following methods.

[Resolution/Profile]

Organic antireflection film DUV 44 (produced by Brewer Science, Inc.) was coated on a silicon wafer to form an antireflection film having a thickness of 60 nm. The resist composition shown in Table 3 below was coated thereon and baked (Pre-Bake; PB) at the temperature shown in Table 3 for 60 seconds to form a resist film having a thickness of 200 nm. The obtained wafer was patternwise exposed through an exposure mask by using a KrF excimer laser scanner (NA: 0.80), and the film was baked at the temperature shown in Table 3 for 60 seconds (Post-Exposure Bake; PEB), developed by puddling the organic developer shown in Table 3, and rinsed by puddling the rinsing solution shown in Table 3. Thereafter, the wafer was spun at a rotation speed of 4,000 rpm for 30 seconds to obtain a line-and-space (1:1) pattern. The minimum resolution pitch below which a line-and-space (1:1) image is not formed was taken as the resolution. A smaller value of minimum resolution pitch indicates higher resolution and better performance.

The cross-sectional profile of the obtained line-and-space (1:1) pattern was evaluated by using a scanning electron microscope (S4800) manufactured by Hitachi High-Technologies Corporation.

[Etching Resistance]

The resist composition shown in Table 3 was coated on a silicon wafer and baked (Pre-Bake; PB) at the temperature shown in Table 3 for 60 seconds to form a resist film of 100 nm. The obtained resist film was subjected to overall exposure at an exposure dose of 50 mJ/cm$^2$ by using a KrF excimer laser scanner (NA: 0.80), then PEB at the temperature shown in Table 3 for 30 seconds, puddle development with the organic developer shown in Table 3, and puddle rinsing with the rinsing solution shown in Table 3, and thereafter, the wafer was spun at a rotation speed of 4,000 rpm for 30 seconds to obtain an exposed film. This exposed film was etched for 30 seconds by using an etching apparatus (M-6000) manufactured by Hitachi High-Technologies Corporation, and the film thickness difference between before and after the etching was measured, whereby the etching rate per second was evaluated. The obtained results were judged as follows.
A: from 7.0 Å/sec to less than 8.5 Å/sec
B: from 8.5 Å/sec to less than 9.5 Å/sec
C: from 9.5 Å/sec to less than 10.5 Å/sec
D: 10.5 Å/sec or more The results are shown in Table 3 below.

TABLE 3

| Evaluation No. | Resist Composition | PB | PEB | Developer | Rinsing Solution | Resolution | Etching Resistance | Profile | Remarks |
|---|---|---|---|---|---|---|---|---|---|
| KrF-01 | Res-01 | 110° C./60 sec. | 110° C./60 sec. | S-1 | S-4 | 125 nm | A | slightly reverse taper | Example |
| KrF-02 | Res-02 | 100° C./60 sec. | 120° C./60 sec. | S-1 | S-6 | 125 nm | C | slightly reverse taper | Example |
| KrF-03 | Res-03 | 100° C./60 sec. | 110° C./60 sec. | S-1 | S-5 | 105 nm | C | rectangular | Example |
| KrF-04 | Res-04 | 100° C./60 sec. | 100° C./60 sec. | S-2 | S-5 | 115 nm | A | rectangular | Example |

TABLE 3-continued

| Evaluation No. | Resist Composition | PB | PEB | Developer | Rinsing Solution | Resolution | Etching Resistance | Profile | Remarks |
|---|---|---|---|---|---|---|---|---|---|
| KrF-05 | Res-05 | 110° C./60 sec. | 110° C./60 sec. | S-3 | S-8 | 115 nm | A | rectangular | Example |
| KrF-06 | Res-06 | 100° C./60 sec. | 110° C./60 sec. | S-1 | S-5 | 110 nm | A | rectangular | Example |
| KrF-07 | Res-07 | 95° C./60 sec. | 100° C./60 sec. | S-1 | S-7 | 110 nm | B | rectangular | Example |
| KrF-08 | Res-08 | 100° C./60 sec. | 100° C./60 sec. | S-2 | S-4 | 105 nm | C | rectangular | Example |
| KrF-09 | Res-09 | 100° C./60 sec. | 110° C./60 sec. | S-1 | S-7 | 120 nm | B | slightly reverse taper | Example |
| KrF-10 | Res-10 | 100° C./60 sec. | 120° C./60 sec. | S-1 | S-5 | 110 nm | B | rectangular | Example |
| KrF-11 | Res-11 | 110° C./60 sec. | 110° C./60 sec. | S-2 | — | 115 nm | A | rectangular | Example |
| KrF-12 | Res-12 | 100° C./60 sec. | 120° C./60 sec. | S-3 | S-8 | 115 nm | A | rectangular | Example |
| KrF-13 | Res-13 | 100° C./60 sec. | 110° C./60 sec. | S-1 | S-5 | 140 nm | A | slight film loss | Example |
| KrF-14 | Res-14 | 100° C./60 sec. | 110° C./60 sec. | S-1 | S-4 | 155 nm | D | film loss | Comparative Example |
| KrF-15 | Res-15 | 100° C./60 sec. | 110° C./60 sec. | S-1 | S-5 | 150 nm | D | reverse taper | Comparative Example |

As apparent from Table 3, in the case of resist composition Res-15 of Comparative Example using a resin having neither one of the repeating units represented by formulae (I) and (II), the etching resistance was poor, the minimum resolution pitch was large, revealing bad resolution, and the profile was a reverse taper.

Also, it is seen that in the case of resist composition Res-14 of Comparative Example using a resin not having a repeating unit represented by formula (II) and containing 20 mol % or more (30 mol %) of a repeating unit represented by formula (I), the etching resistance was poor, the minimum resolution pitch was large, revealing bad resolution, and the profile showed an occurrence of film loss.

On the other hand, it is seen that in all of resist compositions Res-01 to Res-12 of Examples using a resin containing a resin represented by formula (II) without containing a repeating unit represented by formula (I), the etching resistance was good and kept at the practical level, the profile was rectangular and good, and with respect to Res-01, Res-02 and Res-09, the profile was a slightly reverse taper within a practically allowable range.

Furthermore, it is also seen that in the case of resist composition Res-13 of Example using a resin not only containing a repeating unit represented by formula (II) but also containing less than 20 mol % (10 mol %) of a repeating unit represented by formula (I), the minimum resolution pitch was slightly large, the profile had a slight but practically allowable film loss, and the etching resistance was good.

[Formation and Evaluation of Pattern on Stepped Substrate]

With respect to resist compositions Res-03, 05, 07, 09, 11 and 13, formation and evaluation of a pattern on a stepped substrate were performed.

Using the resist compositions above, resist patterns were formed in the same manner as in KrF-01 to 15 except for coating the resist composition on a substrate where steps with a space of 100 nm, a pitch of 500 nm and a height of 100 nm were repeated at regular intervals (manufactured by Advanced Materials Technology), to form a film having a thickness of 200 nm and employing the process conditions shown in Table 4 below, and the profile thereof was evaluated. The results are shown in Table 4. Incidentally, the thickness of the formed film is the height from the bottom of the step (that is, the bottom on the stepped substrate) to the resist film surface (that is, the top of the film).

TABLE 4

| Evaluation No. | Resist Composition | PB | PEB | Developer | Rinsing Solution | Profile | Remarks |
|---|---|---|---|---|---|---|---|
| KrF-16 | Res-03 | 100° C. 60 sec | 110° C. 60 sec | S-1 | S-5 | rectangular | Example |
| KrF-17 | Res-05 | 110° C. 60 sec | 110° C. 60 sec | S-3 | S-8 | rectangular | Example |
| KrF-18 | Res-07 | 95° C. 60 sec | 100° C. 60 sec | S-1 | S-7 | rectangular | Example |
| KrF-19 | Res-09 | 100° C. 60 sec | 110° C. 60 sec | S-1 | S-7 | reverse taper | Example |
| KrF-20 | Res-11 | 110° C. 60 sec | 110° C. 60 sec | S-2 | — | rectangular | Example |
| KrF-21 | Res-13 | 110° C. 60 sec | 110° C. 60 sec | S-1 | S-5 | slight film loss | Example |

As apparent from Table 4, in the case of resist compositions Res-03, 05, 07 and 11 of Examples using a resin containing a repeating unit represented by formula (II) without containing a repeating unit represented by formula (I), the profile was rectangular and good and also with respect to Res-09, the profile was a slightly reverse taper but in a practically allowable range.

Furthermore, it is also seen that in the case of resist composition Res-13 of Example using a resin not only containing a repeating unit represented by formula (II) but also containing less than 20 mol % of (10 mol % of) a repeating unit represented by formula (I), the profile had a slight but practically allowable film loss.

These results reveal that also in the evaluation on a stepped substrate, a profile on a flat substrate could be reproduced and thus, the profile was of practical level and good.

INDUSTRIAL APPLICABILITY

According to the present invention, a pattern forming method in which a practically allowable level of rectangularity is maintained by preventing the resolution and rectangularity from reduction ascribable to unintended dissolution of a pattern part during organic solvent development and the resist pattern has high resolution and etching resistance at dry etching is excellent and which is suitable particularly for KrF exposure, an actinic ray-sensitive or radiation-sensitive resin composition used therefor, a resist film, a method for manufacturing an electronic device, and an electronic device, can be provided.

Also, a pattern forming method suitable particularly for KrF exposure, where an anti-reflective film is not required and in a negative pattern forming method by organic solvent development, a pattern having high rectangularity can be formed on a stepped substrate, an actinic ray-sensitive or radiation-sensitive resin composition used therefor, a resist film, a method for manufacturing an electronic device, and an electronic device, can be provided.

This application is based on Japanese patent application Nos. JP 2011-120956 filed on May 30, 2011, JP 2012-091329 filed on Apr. 12, 2012 and U.S. provisional application No. 61/534,569 filed on Sep. 14, 2011, the entire contents of which are hereby incorporated by reference, the same as if set forth at length.

The invention claimed is:

1. A pattern forming method comprising:
(i) a step of forming a film by using an actinic ray-sensitive or radiation-sensitive resin composition containing:
(A) a resin containing a repeating unit having a group capable of decomposing by the action of an acid to produce a polar group,
(B) a compound capable of generating an acid upon irradiation with an actinic ray or radiation, and
(C) a solvent,
(ii) a step of exposing the film, and
(iii) a step of developing the exposed film by using an organic solvent-containing developer to form a negative pattern,
wherein
the content of a repeating unit represented by the following formula (I) is less than 20 mol % based on all repeating units in the resin (A) and the resin (A) contains a repeating unit having a non-phenolic aromatic group other than the repeating unit represented by the following formula (I):

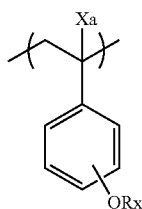

in formula (I),
Xa represents a hydrogen atom or an alkyl group, and
Rx represents a hydrogen atom or a group capable of decomposing and leaving by the action of an acid;
the repeating unit having a non-phenolic aromatic group is a repeating unit represented by the following formula (II):

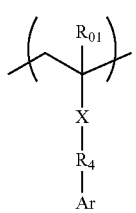

in formula (II),
$R_{01}$ represents a hydrogen atom or an alkyl group,
X represents a single bond or a divalent linking group,
Ar represents a non-phenolic aromatic group, and
$R_4$ represents a single bond or an alkylene group;
the repeating unit having a group capable of decomposing by the action of an acid to produce a polar group is a repeating unit represented by the following formula (III):

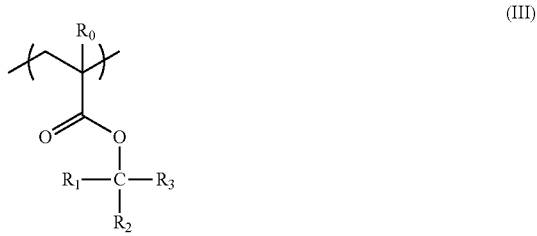

in formula (III),
$R_0$ represents a hydrogen atom or an alkyl group,
each of $R_1$ to $R_3$ independently represents an alkyl group or a cycloalkyl group, and
two members out of $R_1$ to $R_3$ may combine to form a monocyclic or polycyclic cycloalkyl group;
the resin (A) does not contain a repeating unit having an acid group, wherein the acid group is selected from the group consisting of a carboxyl group, a sulfonamide group, a sulfonylimide group, a bissulfonylimide group, and an aliphatic alcohol substituted with an electron-withdrawing group at the α-position; and
the content of the repeating unit having a non-phenolic aromatic group is from 10 to 70 mol % based on all repeating units in the resin (A).

2. The pattern forming method as claimed in claim 1, wherein (ii) the step of exposing the film is performed with a KrF excimer laser, an EUV light or an electron beam.

3. The pattern forming method as claimed in claim 1, wherein (ii) the step of exposing the film is performed with a KrF excimer laser.

4. The pattern forming method as claimed in claim 1, wherein the resin (A) does not contain the repeating unit represented by formula (I).

5. The pattern forming method as claimed in claim 1, wherein in formula (II), X is —COO— or —CONH—.

6. The pattern forming method as claimed in claim 1, wherein the content of the repeating unit represented by formula (III) is from 20 to 90 mol % based on all repeating units in the resin (A).

7. The pattern forming method as claimed in claim 1, wherein the developer is a developer containing at least one kind of an organic solvent selected from the group consisting of a ketone-based solvent, an ester-based solvent, an alcohol-based solvent, an amide-based solvent and an ether-based solvent.

8. A method for manufacturing an electronic device, comprising the pattern forming method claimed in claim 1.

9. An electronic device manufactured by the method for manufacturing an electronic device claimed in claim 8.

10. An actinic ray-sensitive or radiation-sensitive resin composition comprising:
(A) a resin containing a repeating unit having a group capable of decomposing by the action of an acid to produce a polar group, (B) a compound capable of generating an acid upon irradiation with an actinic ray or radiation, and
(C) a solvent,
wherein
the content of a repeating unit represented by the following formula (I) is less than 20 mol % based on all repeating units in the resin (A) and the resin (A) contains a repeating unit having a non-phenolic aromatic group other than the repeating unit represented by the following formula (I):

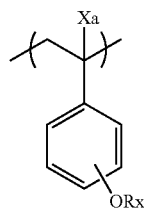
(I)

in formula (I),
Xa represents a hydrogen atom or an alkyl group, and
Rx represents a hydrogen atom or a group capable of decomposing and leaving by the action of an acid;
the repeating unit having a non-phenolic aromatic group is a repeating unit represented by the following formula (II):

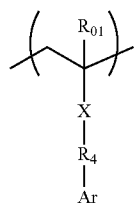
(II)

in formula (II),
$R_{01}$ represents a hydrogen atom or an alkyl group,
X represents a single bond or a divalent linking group,
Ar represents a non-phenolic aromatic group, and
$R_4$ represents a single bond or an alkylene group;
the repeating unit having a group capable of decomposing by the action of an acid to produce a polar group is a repeating unit represented by the following formula (III):

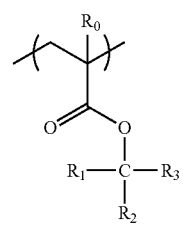
(III)

in formula (III),
$R_0$ represents a hydrogen atom or an alkyl group,
each of $R_1$ to $R_3$ independently represents an alkyl group or a cycloalkyl group, and
two members out of $R_1$ to $R_3$ may combine to form a monocyclic or polycyclic cycloalkyl group;
the resin (A) does not contain a repeating unit having an acid group, wherein the acid group is selected from the group consisting of a carboxyl group, a sulfonamide group, a sulfonylimide group, a bissulfonylimide group, and an aliphatic alcohol substituted with an electron-withdrawing group at the α-position; and
the content of the repeating unit having a non-phenolic aromatic group is from 10 to 70 mol % based on all repeating units in the resin (A).

11. The actinic ray-sensitive or radiation-sensitive resin composition as claimed in claim 10, wherein the content of the repeating unit having a non-phenolic aromatic group is from 20 to 60 mol % based on all repeating units in the resin (A).

12. The actinic ray-sensitive or radiation-sensitive resin composition as claimed in claim 10, wherein the content of the repeating unit having a non-phenolic aromatic group is from 30 to 50 mol % based on all repeating units in the resin (A).

* * * * *